(12) United States Patent
Liu et al.

(10) Patent No.: US 12,720,847 B2
(45) Date of Patent: Aug. 25, 2026

(54) MULTI-GATE DEVICES WITH IMPROVED PERFORMANCE AND METHODS OF FABRICATING THE SAME

(71) Applicant: Taiwan Semiconductor Manufacturing Company, Ltd., Hsin-Chu (TW)

(72) Inventors: Ko-Cheng Liu, Hsinchu City (TW); Chang-Miao Liu, Hsinchu City (TW); Huiling Shang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 706 days.

(21) Appl. No.: 18/295,346

(22) Filed: Apr. 4, 2023

(65) Prior Publication Data

US 2024/0339362 A1 Oct. 10, 2024

(51) Int. Cl.

| | |
|---|---|
| ***H10D 84/03*** | (2025.01) |
| ***H10D 84/01*** | (2025.01) |
| ***H10D 84/85*** | (2025.01) |
| ***H10W 10/00*** | (2026.01) |
| ***H10W 10/17*** | (2026.01) |

(52) U.S. Cl.

CPC ......... *H10D 84/038* (2025.01); *H10D 84/017* (2025.01); *H10D 84/0188* (2025.01); *H10D 84/85* (2025.01); *H10W 10/014* (2026.01); *H10W 10/17* (2026.01)

(58) Field of Classification Search

CPC ........................... H10D 84/83; H10D 84/0151

See application file for complete search history.

(56) References Cited

U.S. PATENT DOCUMENTS

| | | | |
|---|---|---|---|
| 2021/0273096 A1* | 9/2021 | Yang | H10D 84/017 |
| 2022/0416046 A1 | 12/2022 | Li et al. | |
| 2023/0019386 A1 | 1/2023 | Cheng et al. | |
| 2023/0068668 A1 | 3/2023 | Liu et al. | |
| 2024/0321738 A1* | 9/2024 | Guler | H10D 30/47 |

FOREIGN PATENT DOCUMENTS

| | | |
|---|---|---|
| TW | 202036904 A | 10/2020 |
| TW | 202238692 A | 10/2022 |

OTHER PUBLICATIONS

Liu et al., "Isolation for Multigate Devices," U.S. Appl. No. 17/833,322, filed Jun. 6, 2022, Assignee: Taiwan Semiconductor Manufacturing Company, Ltd., 51 pages specification, 27 pages drawings.

* cited by examiner

*Primary Examiner* — Fernando L Toledo
*Assistant Examiner* — Adam S Bowen
(74) *Attorney, Agent, or Firm* — HAYNES AND BOONE, LLP

(57) ABSTRACT

Semiconductor structures and methods are provided. In an embodiment, a semiconductor structure includes a substrate including a first mesa structure and a second mesa structure, an isolation feature extending between the first mesa structure and the second mesa structure, a first vertical stack of nanostructures directly over the first mesa structure, first source/drain features coupled to the first vertical stack of nanostructures, a dielectric layer comprising a first portion disposed on the isolation feature and a second portion disposed between the first-type source/drain features and the substrate, and a first gate structure wrapping around each nanostructure of the first vertical stack of nanostructures.

20 Claims, 37 Drawing Sheets

200
209
208t
206t
208m
206m
208b
206b
204
202t
202
Z
X
Y

200
B
B'
T
202t
202
200A
200B
T1
T2
T3
Z
Y
X 200
236
236
218
230P
230P
230P
234
232
226
202t'
202
210SD
210C
210SD
210C
210SD
Z
X
Y 200
236
236
208t
206t
208m
206m
208b
206b
214c'
202
202t'
200A
200B
Z
Y
X 200
236
236
218
234
232
208t
208m
238
208b
226
202t'
230P
230P
202
210SD
210C
210SD
210C
210SD
Z
Y
X 200
208t
238
208m
208b
202t'
202
214c'
200A
200B
Z
X
Y

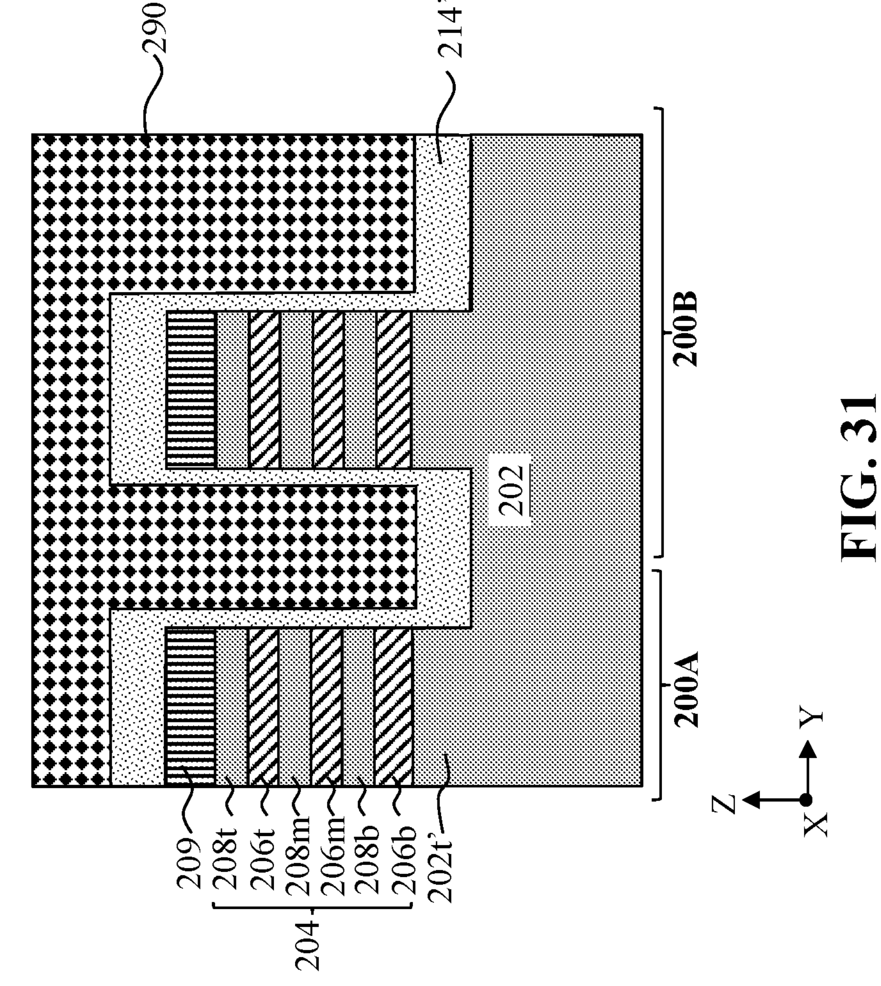
FIG. 31

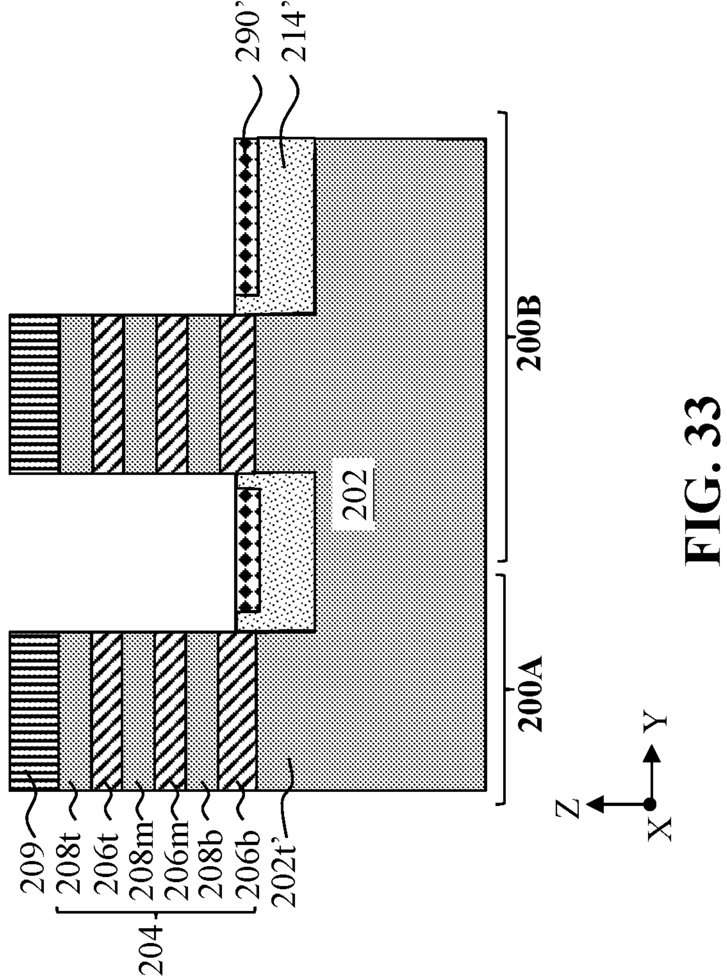
FIG. 33

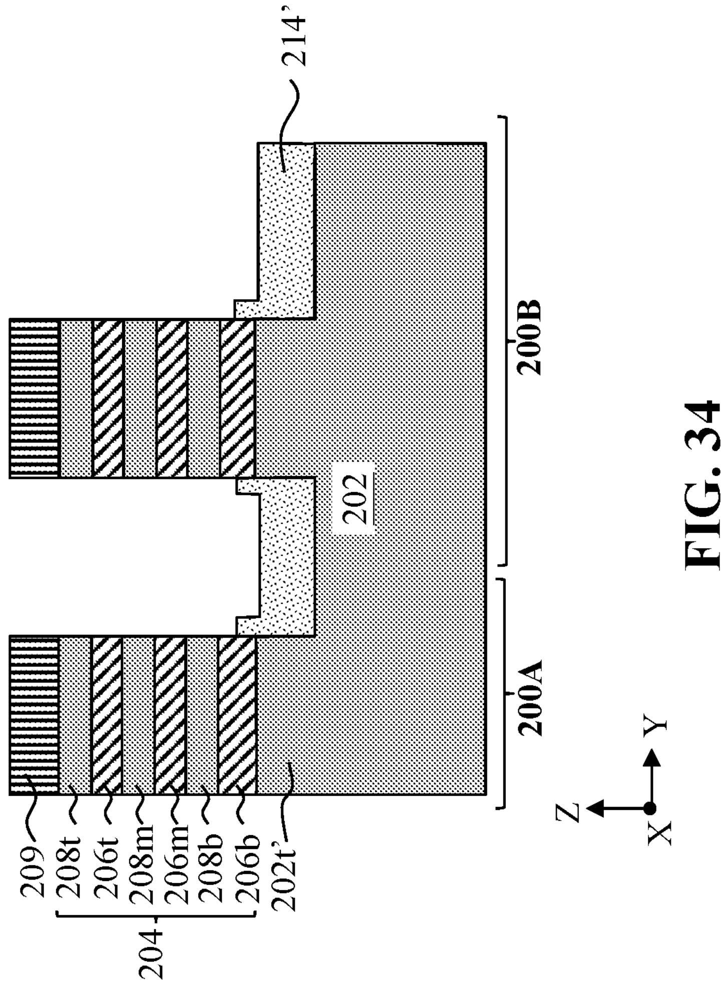
214'
200B
202
200A
209
208t
206t
208m
206m
208b
206b
202t'
204
Z
Y
X
FIG. 34
200

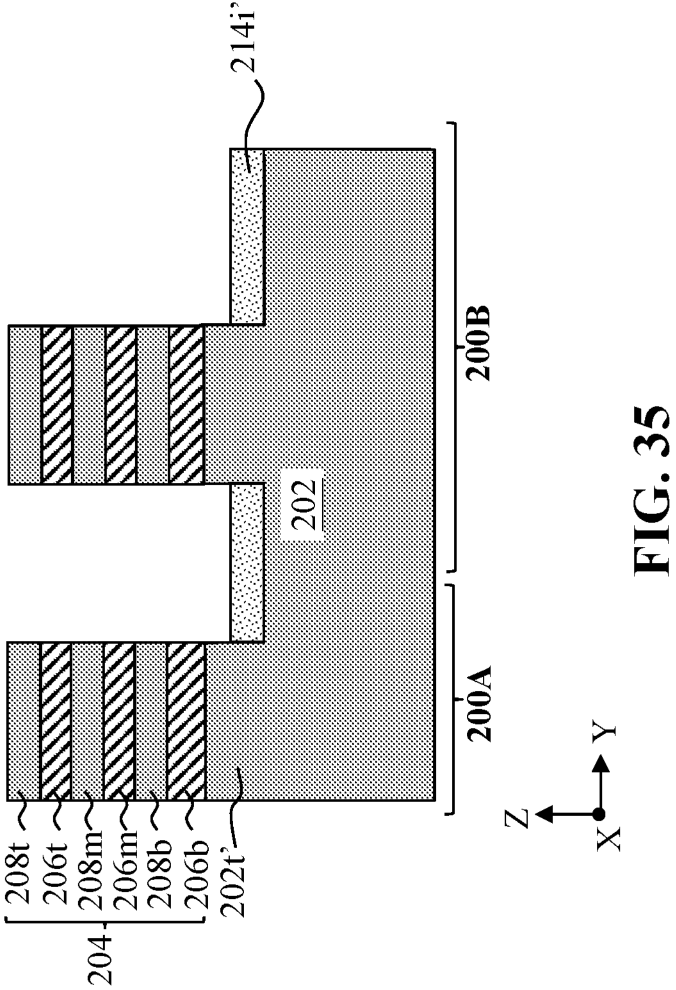
FIG. 35

MULTI-GATE DEVICES WITH IMPROVED PERFORMANCE AND METHODS OF FABRICATING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistors (multi-gate metal-oxide-semiconductor field-effect transistors (MOSFETs), or multi-gate devices) have been introduced to improve gate control by increasing gate-channel coupling, reducing off-state current, and reducing short-channel effects (SCEs). A multi-gate device generally refers to a device having a gate structure, or a portion thereof, disposed over more than one side of a channel region. Multi-bridge-channel (MBC) transistors are examples of multi-gate devices that have become popular and promising candidates for high performance and low leakage applications. An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. While existing GAA transistors are generally adequate for their general purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 30, 31, 32, 33, 34, and 35 illustrate fragmentary cross-sectional views of an exemplary workpiece taken along line A-A' shown in FIG. 3 during various fabrication stages in the method of FIG. 29, according to one or more aspects of the present disclosure.

DETAILED DESCRIPTION

Figure 1:
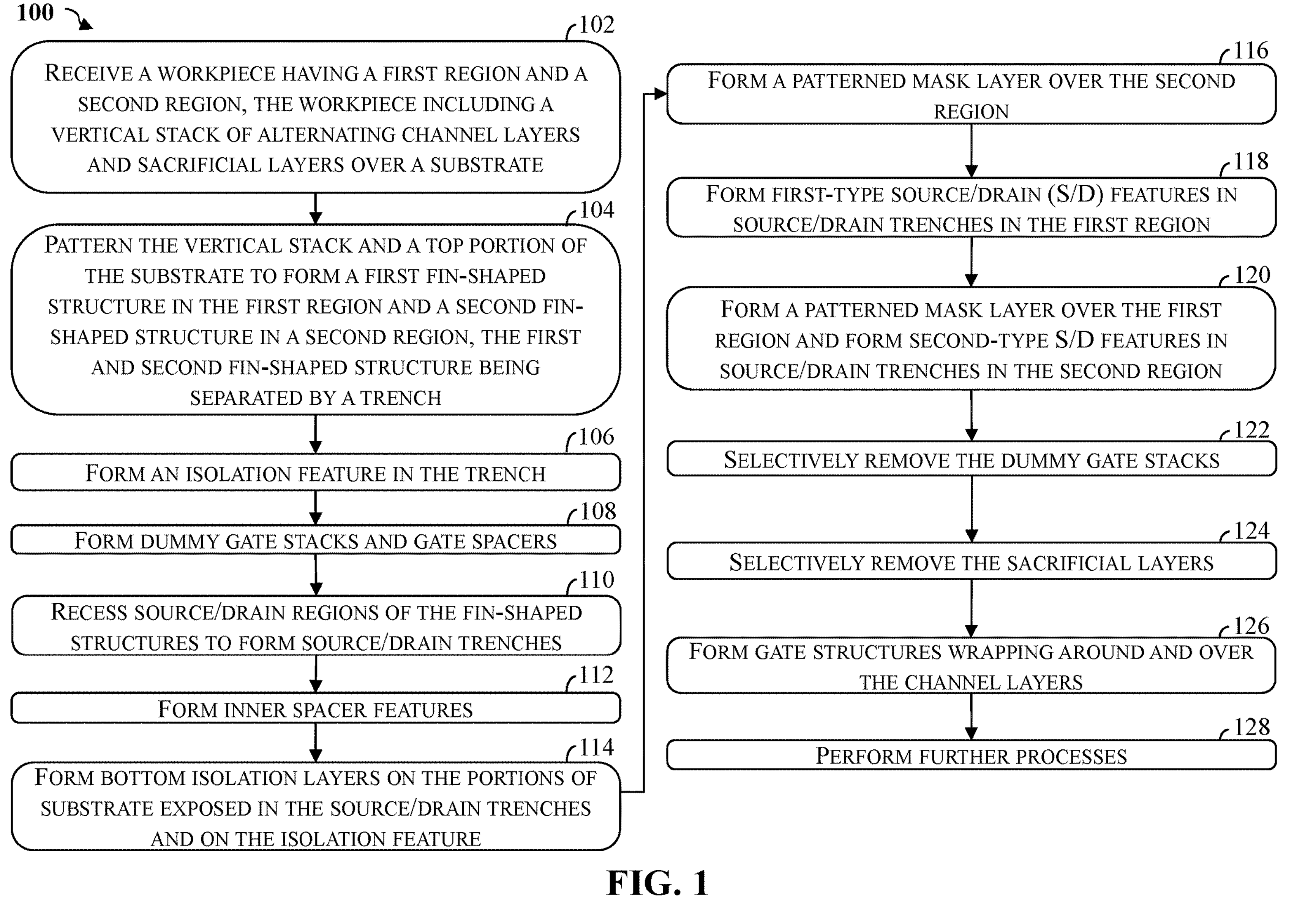
FIG. 1 illustrates a flowchart of an exemplary method for fabricating a semiconductor structure, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

GAA transistor includes channel layers (regions) that are vertically or horizontally stacked and suspended in a manner over a substrate that allows a gate structure to wrap around (or surround) and engage the channel layers. The channel layers extend between a source and a drain, and voltage can be applied to the gate structure, the source, and/or the drain to control a flow of current between the source and the drain. However, leakage current of GAA transistors has arisen as a significant challenge as IC technology nodes scale. For example, a parasitic transistor can form between the gate structure, an elevated portion ("mesa structure") of the substrate (over which the channel layers and gate structure are disposed), and the epitaxial source/drains, and current may undesirably flow/leak through the mesa structure between the epitaxial source/drains. Since the gate structure wraps the mesa structure in existing GAA transistors as opposed to surrounding it like the channel layers, the gate structure's control of the off-state leakage current in the mesa structure is limited to three sides (e.g., tri-gate control), which has proved insufficient as IC technology nodes scale and has been observed to induce and/or exacerbate drain-induced-barrier-lowering (DIBL) in GAA transistors.

In addition, formation of a GAA transistor includes formation of a stack that includes a number of channel layers interleaved by a number of sacrificial layers over the substrate, where the sacrificial layers may be selectively removed to release the channel layers as channel members. The stack and a top portion of the substrate are patterned to form active regions separated by deep trenches. Isolation features (e.g., shallow trench isolation (STI) features) are then formed in the deep trenches to separate adjacent active regions. However, existing STI features in GAA transistors may be thick, and their formation may include using flowable chemical vapor deposition (FCVD) to form a dielectric layer and then annealing the dielectric layer at a high temperature for hours to consolidate the dielectric layer. The anneal process has a high thermal budget and will disadvantageously impact the performance of the GAA transistors. For example, germanium and/or defects in the sacrificial layers may diffuse into channel layers during this high thermal budget process. In addition, in embodiments where the dielectric layer includes oxides (e.g., silicon oxide), germanium in the sacrificial layers may be oxidized under this high thermal budget process. Thus, existing methods for forming STI features in GAA transistors may disadvantageously increase defects in the channel layers, lowering carrier mobilities, and decreasing electrical performance.

The present disclosure provides semiconductor structures with improved electrical performance and methods for forming the same. In an embodiment, a method includes forming a stack of alternating channel layers and sacrificial layers over a substrate, patterning the stack and a portion of the substrate to form fin-shaped structures (e.g., active regions) separated by a trench, forming a thin dielectric layer at the bottom of the trench to separate the fin-shaped structures, forming bottom isolation layers in source/drain recesses, and forming source/drain features on the bottom isolation layers. In the present embodiments, the thin dielectric layer is formed by processes having low thermal budget. For example, in an embodiment, the thin dielectric layer includes silicon nitride formed by a low thermal budget process and is free of oxygen. Thus, the performance of the GAA transistors may be improved. In addition, the bottom isolation layers are formed between the source/drain features and the substrate to substantially suppress and/or eliminate any parasitic transistor formed between the gate stack, source/drain features, and underlying mesa structure(s), thereby reducing and/or blocking leakage current through the mesa structure(s). GAA transistors disclosed herein thus exhibit better off-state control and/or overall improved performance.

The various aspects of the present disclosure will now be described in more detail with reference to the figures. In that regard, FIG. 1 is a flowchart illustrating method 100 of forming a semiconductor structure according to embodiments of the present disclosure. Method 100 is described below in conjunction with FIGS. 2A-22B, which are fragmentary top views and/or cross-sectional views of a workpiece 200 at fabrication stages according to embodiments of method 100. FIG. 23 is a flowchart illustrating method 300 of forming an alternative semiconductor structure according to embodiments of the present disclosure. Method 300 is described below in conjunction with FIGS. 24A-28B, which are fragmentary cross-sectional views of a workpiece 400 at fabrication stages according to embodiments of method 300. FIG. 29 is a flowchart illustrating method 500 of forming an isolation structure in the semiconductor structure according to embodiments of the present disclosure. Method 500 is described below in conjunction with FIGS. 30-35, which are fragmentary cross-sectional views of the workpiece 200 at fabrication stages according to embodiments of method 500. Methods 100, 300, and 500 are merely examples and are not intended to limit the present disclosure to what is explicitly illustrated therein. Additional steps may be provided before, during and after the method 100/300/500, and some steps described can be replaced, eliminated, or moved around for additional embodiments of the methods. Not all steps are described herein in detail for reasons of simplicity. Because the workpiece 200/400 will be fabricated into a semiconductor structure 200/400 upon conclusion of the fabrication processes, the workpiece 200/400 may be referred to as the semiconductor structure 200/400 as the context requires. For avoidance of doubts, the X, Y and Z directions in FIGS. 2A-35 are perpendicular to one another and are used consistently throughout FIGS. 2A-35. Throughout the present disclosure, like reference numerals denote like features unless otherwise excepted.

Figures 2A, 2B:
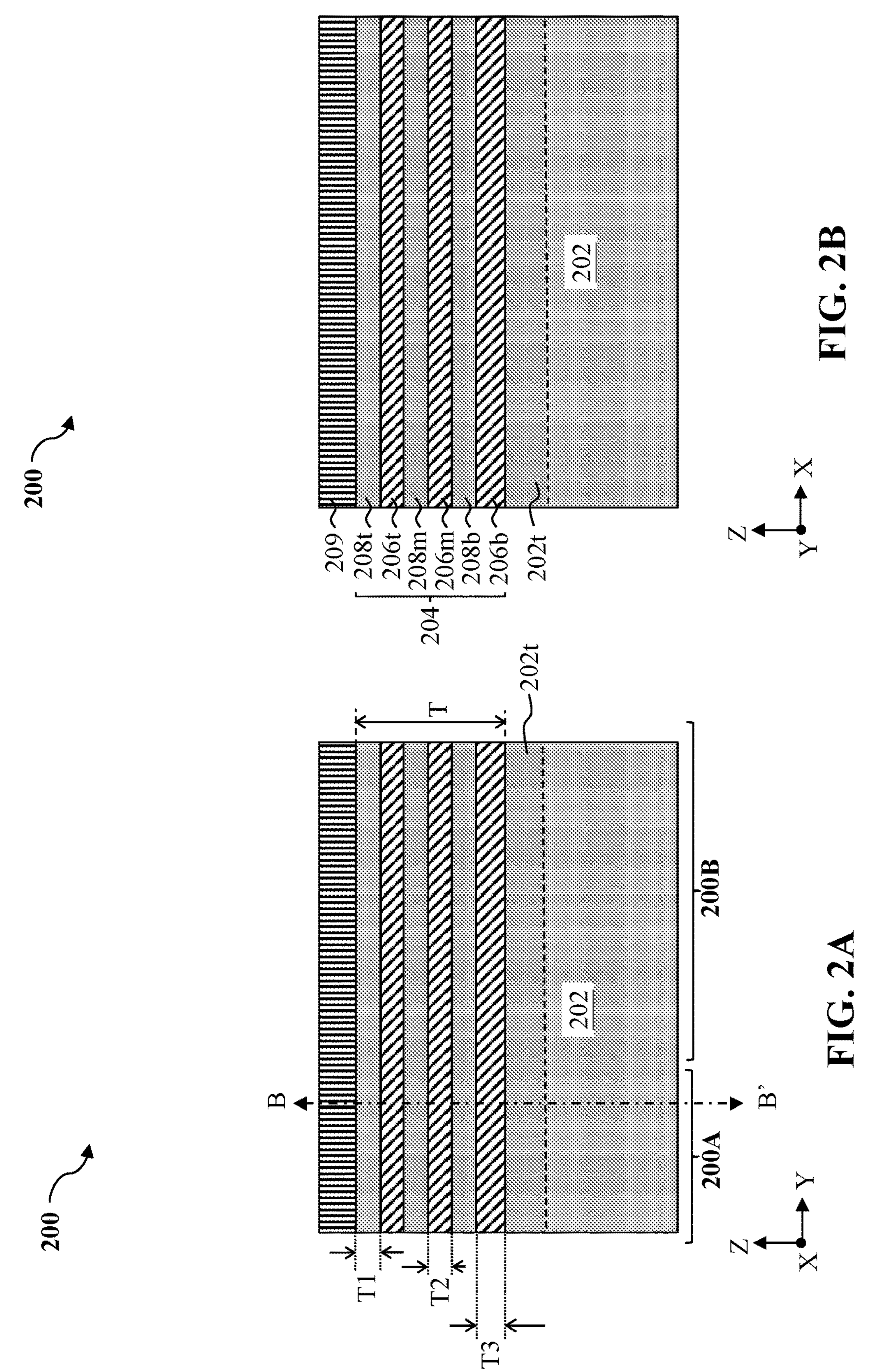
FIGS. 2A, 4A, 5A, 6A, 8A, 9A, 10A, 11A, 13A, 15A, 17A, 19A, and 20C illustrate fragmentary cross-sectional views of an exemplary workpiece taken along line A-A' shown in FIG. 3 during various fabrication stages in the method of FIG. 1, according to one or more aspects of the present disclosure.
FIGS. 2B, 4B, 5B, 6B, 8B, 9B, 10B, 11B, 13B, 17B, 20B, 21B and 22B illustrate fragmentary cross-sectional views of an exemplary workpiece taken along line B-B' shown in FIG. 3 during various fabrication stages in the method of FIG. 1, according to one or more aspects of the present disclosure.

Referring to FIGS. 1 and 2A-2B, method 100 includes a block 102 where a workpiece 200 is received. FIG. 2B depicts a fragmentary cross-sectional view of the workpiece 200 taken along line B-B' shown in FIG. 2A. In the present embodiments, the workpiece 200 includes a first region 200A for formation of p-type GAA transistors and a second region 200B for formation of n-type GAA transistors. The workpiece 200 includes a substrate 202. In an embodiment, the substrate 202 is a bulk silicon substrate (i.e., including bulk single-crystalline silicon). The substrate 202 may include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator (SGOI) substrate, or a germanium-on-insulator (GeOI) substrate, and includes a carrier, an insulator on the carrier, and a semiconductor layer on the insulator. The substrate 202 can include various doped regions configured according to design requirements of semiconductor structure 200. P-type doped regions may include p-type dopants, such as boron (B), boron difluoride ($BF_2$), other p-type dopant, or combinations thereof. N-type doped regions may include n-type dopants, such as phosphorus (P), arsenic (As), other n-type dopant, or combinations thereof. The various doped regions can be formed directly on and/or in substrate 202, for example, providing a p well structure, an n well structure, or combinations thereof. An ion implantation process, a diffusion process, and/or other suitable doping process can be performed to form the various doped regions. In an embodiment, the substrate 202 includes an n well in the first region 200A and a p well in the second region 200B.

Still referring to FIGS. 2A-2B, the workpiece 200 also includes a vertical stack 204 of alternating semiconductor layers disposed over the substrate 202 and in the first region 200A and the second region 200B. In an embodiment, the vertical stack 204 includes a number of channel layers (e.g., bottom channel layer 208*b*, middle channel layer 208*m*, top channel layer 208*t*) interleaved by a number of sacrificial layers (e.g., bottom sacrificial layer 206*b*, middle sacrificial layer 206*m*, top sacrificial layer 206*t*). Each channel layer may include a semiconductor material such as, silicon, germanium, silicon carbide, silicon germanium, GeSn, SiGeSn, SiGeCSn, other suitable semiconductor materials, or combinations thereof, while each sacrificial layer has a composition different from that of the channel layer. In an embodiment, the channel layers include silicon (Si), the sacrificial layers include silicon germanium (SiGe). It is noted that three layers of the sacrificial layers and three layers of the channel layers are alternately and vertically arranged as illustrated in FIGS. 2A-2B, which are for illustrative purposes only and not intended to limit the present disclosure to what is explicitly illustrated therein. It is understood that any number of sacrificial layers and channel layers can be formed in the stack 204. The number of layers depends on the desired number of channels members of devices in the semiconductor structure 200. In some embodiments, the number of the channel layers is between 2 and 10. In the present embodiments, each of the channel layers 208*b*, 208*m*, and 208*t* has a same thickness T1. Each of the top and middle sacrificial layers 206*t* and 206*m* has a thickness T2, and the bottom sacrificial layer 206*b* has a thickness T3 greater than T2 to facilitate the formation of bottom isolation layers 226. In an embodiment, a total thickness T of the vertical stack 204 is between about 50 nm and about 60 nm, T1 is between about 6 nm and about 10 nm, T2 is between about 8 nm and about 10 nm, and T3 is between about 10 nm and about 20 nm.

Still referring to FIGS. 2A-2B, the workpiece 200 also includes a hard mask layer 209 formed over the vertical stack 204. The hard mask layer 209 may include any suitable materials, such as a semiconductor material or a dielectric material, as long as its composition is different from those of the channel layers and the sacrificial layers and the dielectric layer 214 (shown in FIG. 5A) to allow selective removal by an etching process. In an embodiment, the hard mask layer 209 includes, for example, silicon oxide.

Figure 3:
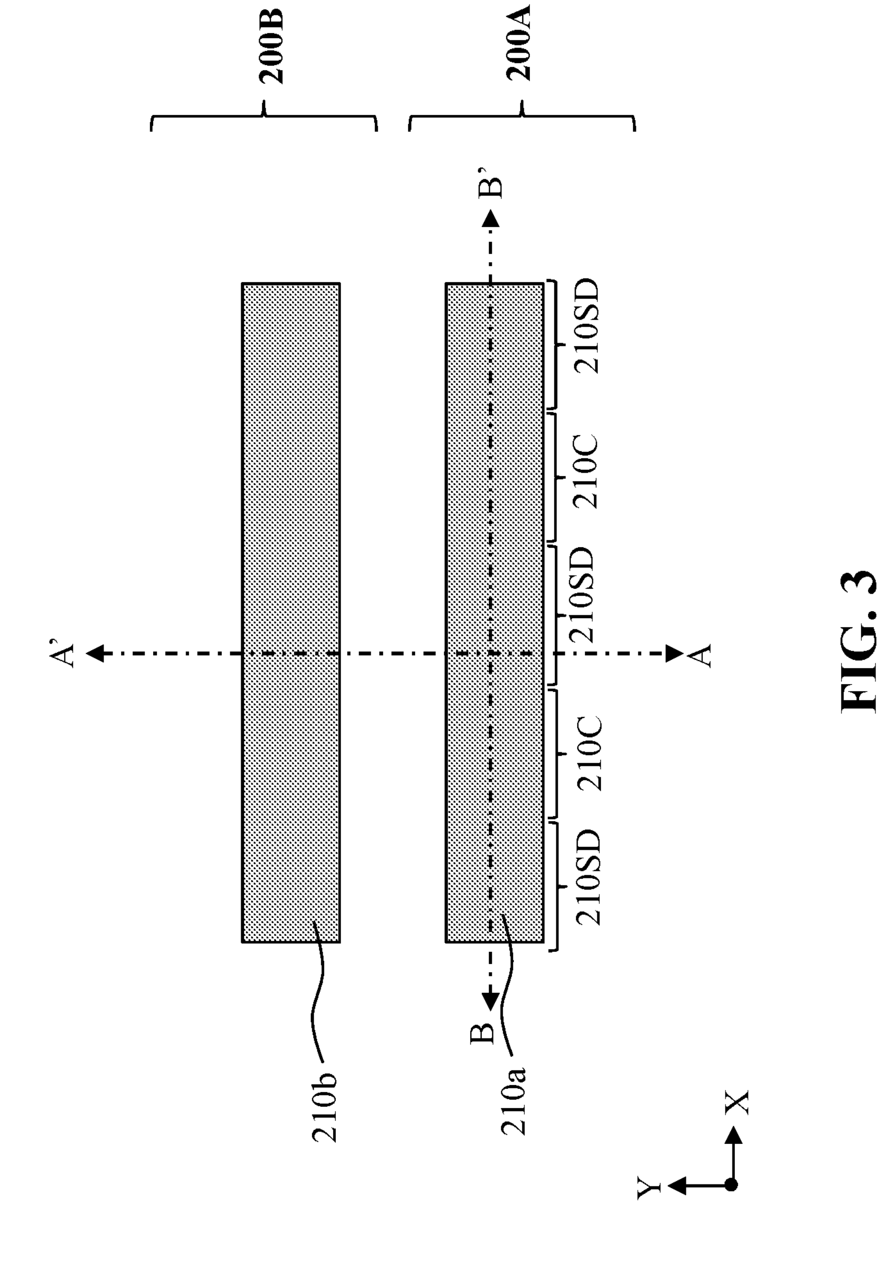
FIGS. 3, 7, 12, 14, 16, 18, illustrate fragmentary top views of the exemplary workpiece during various fabrication stages in the method of FIG. 1, according to one or more aspects of the present disclosure.

Referring to FIGS. 1, 3 and 4A-4B, method 100 includes a block 104 where the vertical stack 204 and a top portion 202*t* of the substrate 202 are patterned to form a fin-shaped structure 210*a* in the first region 200A and a fin-shaped structure 210*b* in the second region 200B. FIG. 3 depicts a fragmentary top view of the workpiece 200 having the fin-shaped structure 210*a* and the fin-shaped structure 210*b*. It is noted that the patterned hard mask layer 209 is omitted in FIG. 3. As shown in FIG. 3, each of the fin-shaped structures 210*a*-210*b* extends lengthwise along the X direction and includes channel regions 210C and source/drain regions 210SD. Source/drain region(s) may refer to a source region or a drain region, individually or collectively dependent upon the context. Each channel region 210C is disposed between two source/drain regions 210SD. It is noted that one fin-shaped structure is formed in the first region 200A and one fin-shaped structure is formed in the second region 200B as illustrated in FIG. 3, which are for illustrative purposes only and not intended to limit the present disclosure to what is explicitly illustrated therein.

Figures 4A, 4B:
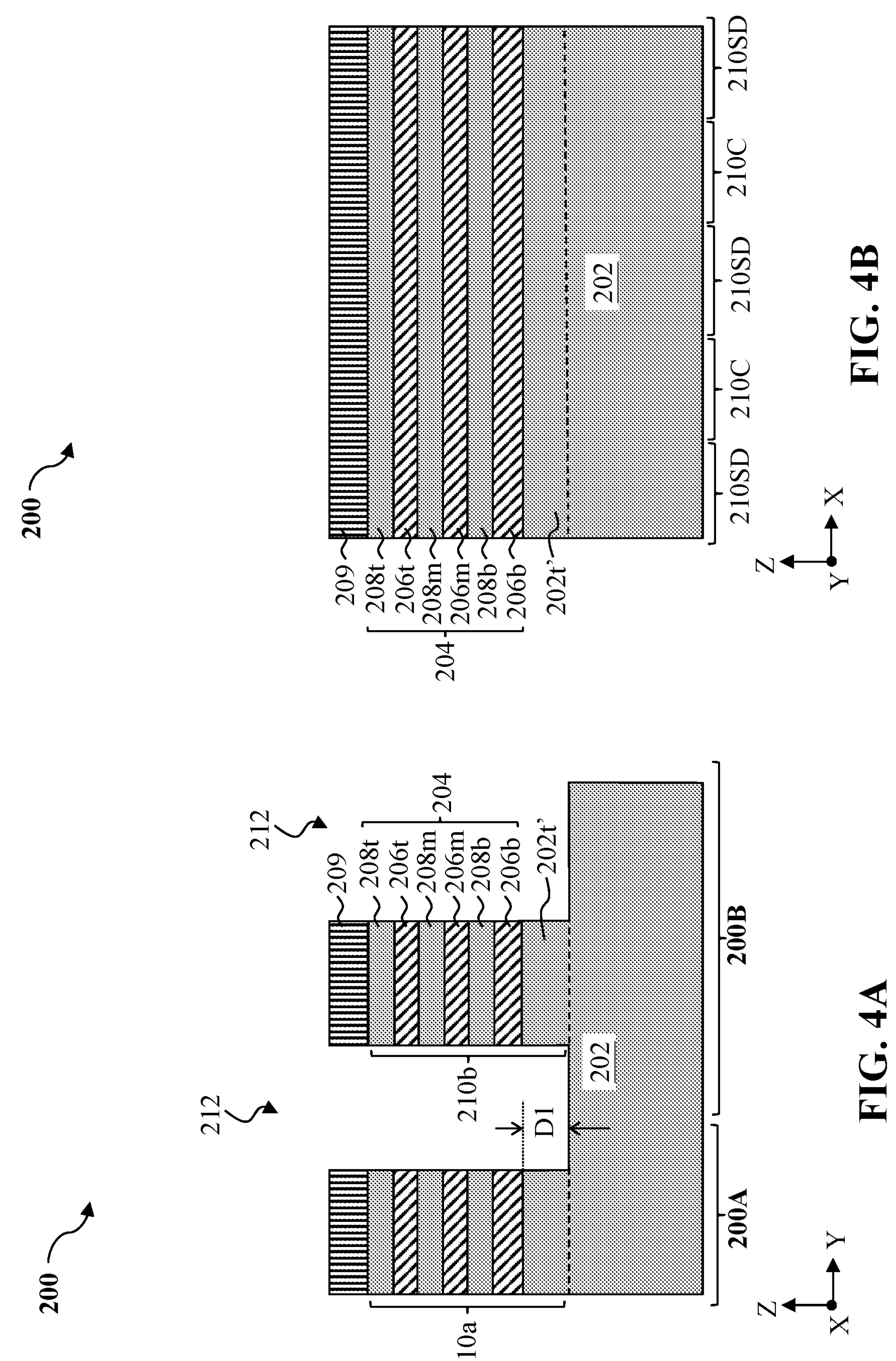

FIG. 4A depicts a fragmentary cross-sectional view of the workpiece 200 taken along line A-A' shown in FIG. 3, and FIG. 4B depicts a fragmentary cross-sectional view of the workpiece 200 taken along line B-B' shown in FIG. 3. As depicted in FIGS. 4A-4B, the hard mask layer 209 is patterned to expose portions of the vertical stack 204. The patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. While using the patterned hard mask layer 209 as an etch mask, an etching process is performed to etch the exposed portions of the vertical stack 204 and parts of the top portion of the substrate 202 thereunder to form the fin-shaped structures 210*a*-210*b* and trenches 212 isolating the fin-shaped structures 210*a*-210*b*. The patterned top portions 202*t* of the substrate 202 in the fin-shaped structures 210*a*-210*b* may also be referred to as mesa structures 202*t*'. The mesa structures 202*t*' each may have a height D1 along the Z direction. In an embodiment, to facilitate the formation of a satisfactory isolation feature between the fin-shaped structure 210*a* and the fin-shaped structure 210*b* without substantially introducing defects to the channel layers or substantially affecting the electrical performance of the final structure, a ratio of the height D1 to the thickness T1 is between about 1 and about 2. In an embodiment, the height D1 may be between about 10 nm and about 20 nm. In an embodiment, D1 is equal to T3.

Figures 5A, 5B:
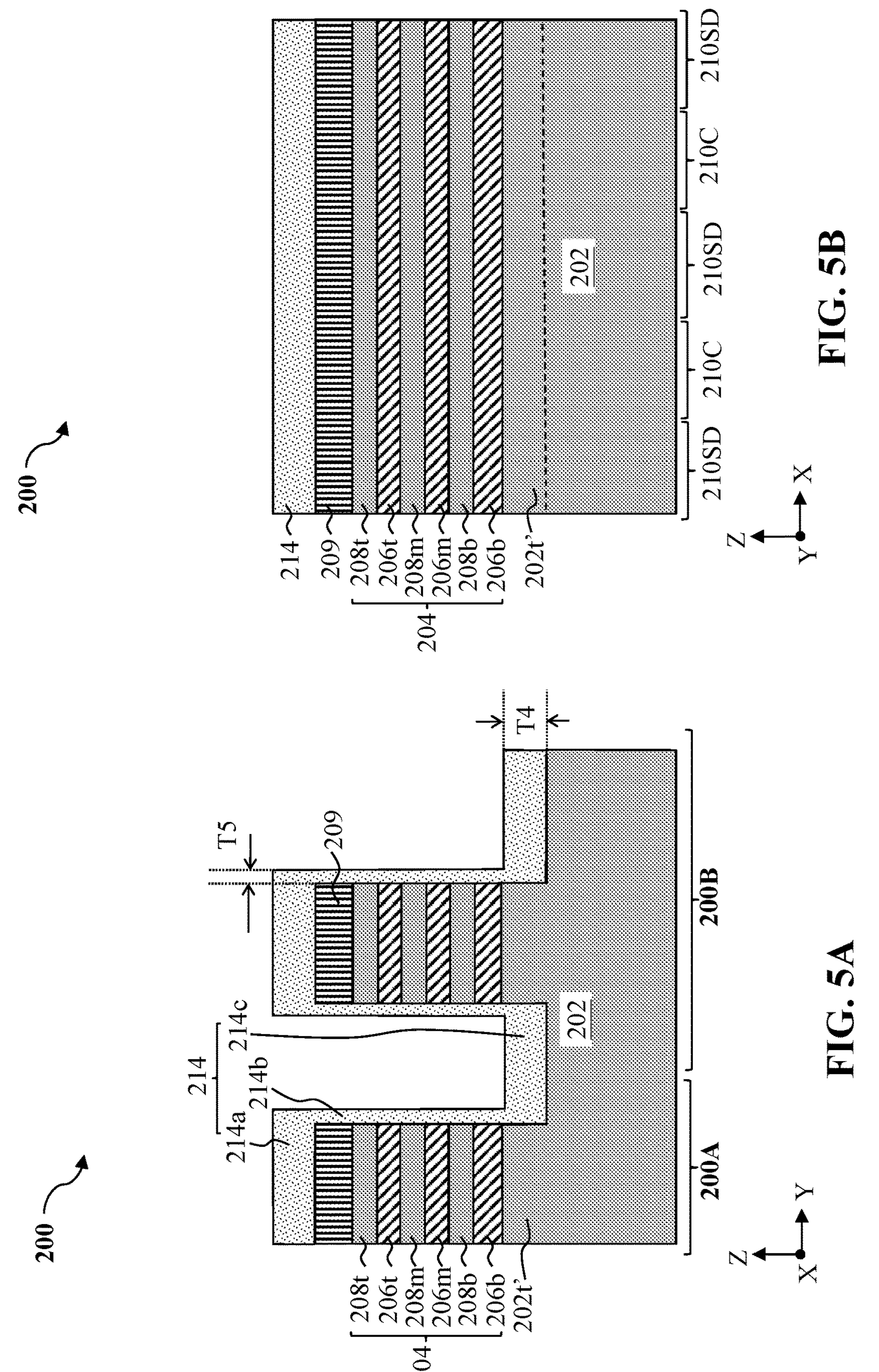

Referring to FIGS. 1, 5A-5B and 6A-6B, method 100 includes a block 106 where an isolation feature 214*c*' is formed between the two adjacent fin-shaped structures 210*a*-210*b*. As depicted in FIGS. 5A-5B, a dielectric layer 214 is formed over the workpiece 200. Since the mesa structure 202*t*' has the thickness D1 that is between about 10 nm and 20 nm, a depth of the trench 212 is significantly reduced compared to a depth (e.g., more than 100 nm) of the trench in other GAA transistors. Instead of using flowable chemical vapor disposing (FCVD) to form a dielectric layer to substantially fill the trench 212 and performing a high-temperature (e.g., more than 600° C.) annealing process for hours to consolidate the FCVD-formed dielectric layer, in the present embodiments, the dielectric layer 214 is deposited by using a CVD, PVD, ALD or other suitable processes to partially fill the trench 212, and the deposition thickness of the dielectric layer 214 may be dependent on a desired thickness T4 of a bottom portion 214*c* of the dielectric layer 214 that is in direct contact with the substrate 202. The deposition temperature of the dielectric layer 214 may be less than 350° C. and no anneal process is needed. Thus, defects that may be caused or diffused due to the high thermal budget annealing process may be significantly reduced.

In an embodiment, the dielectric layer 214 is deposited by using a physical vaper deposition (PVD) process. Due to the properties of the PVD process, a portion of the dielectric layer 214 formed on a top or planar surface is thicker than a portion of the dielectric layer 214 formed on a side surface. For example, a portion 214*a* of the dielectric layer 214 formed on the top surface of the patterned hard mask layer 209 and a portion 214*c* of the dielectric layer 214 formed on the top surface of the substrate 202 each has a thickness T4 that is greater than a thickness T5 of a portion 214*b* of the dielectric layer 214 formed on the sidewall surfaces of the fin-shaped structures 210*a*-210*b*. In the present embodiments, to achieve satisfactory isolation between the two fin-shaped structures 210*a*-210*b* without forming a thick dielectric layer that requires a high thermal budget process while providing margins for subsequent etching processes, the thickness T4 is no less than the height D1 of the mesa structure 202*t*'. The dielectric layer 214 may be formed of any suitable dielectric material such as a low-k dielectric material, so long as its composition is different from those of the channel layers, the sacrificial layers and the hard mask layer 209 to allow selective removal by an etching process. In an embodiment, the dielectric layer 214 is oxygen-free and includes, for example, silicon nitride.

Figures 6A, 6B:
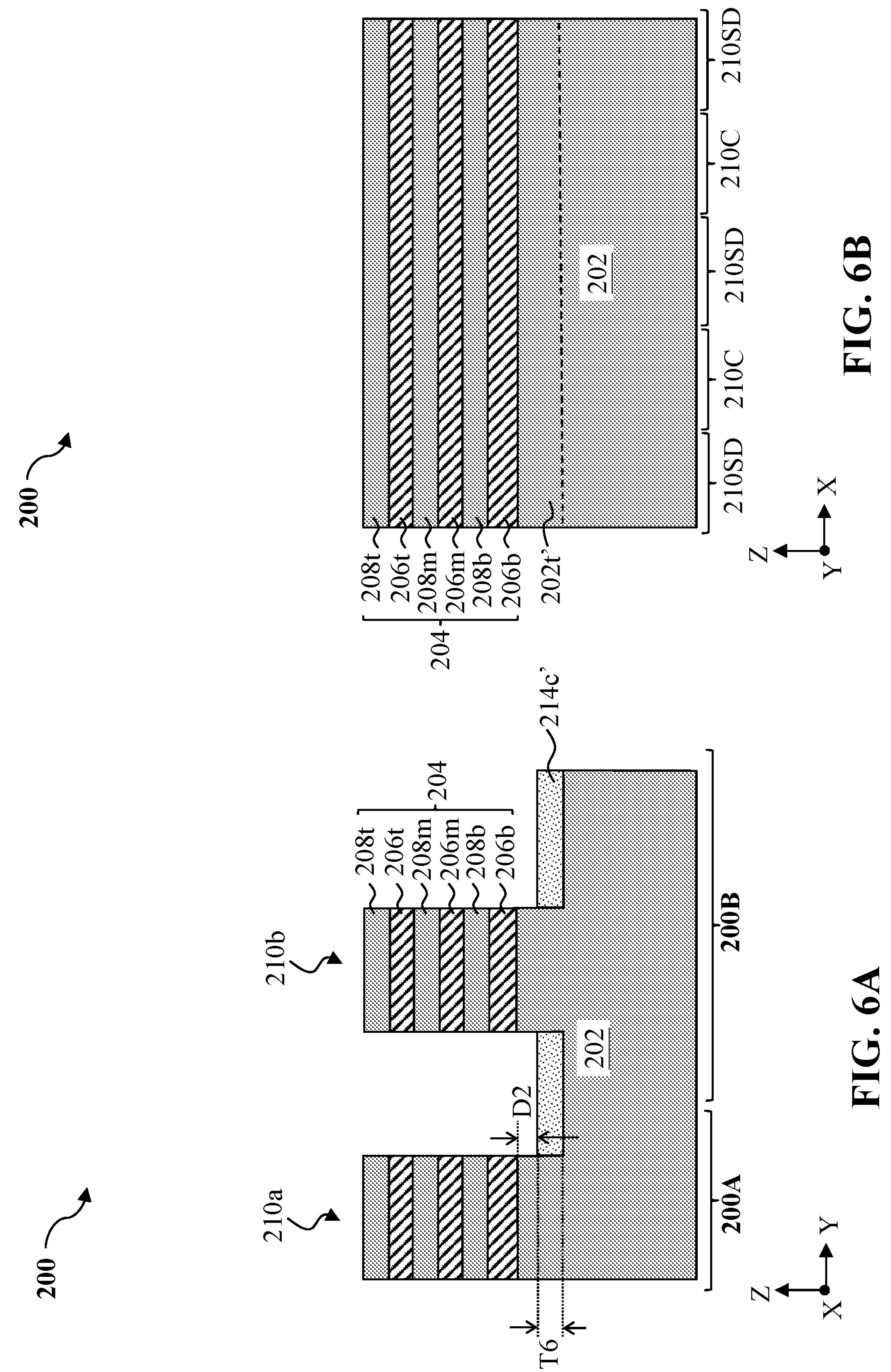

Referring to FIGS. 6A-6B, after the deposition of the dielectric layer 214, a chemical-mechanical planarization/polishing (CMP) process may be performed to the workpiece 200 until the top surface of the hard mask layer 209 is exposed. That is, the CMP process removes the portion 214*a* of the dielectric layer formed on the patterned hard mask layer 209. An etching process may be then performed to selectively etch back the remaining portion (e.g., the portion 214*b* and the portion 214*c*) of the dielectric layer 214. In an embodiment, the etching process is an isotropic etching process. The etching process is stopped after the portion 214*b* of the dielectric layer 214 is removed. The portion 214*c* of the dielectric layer 214 is also partially etched by the etching process, thereby forming the dielectric layer 214*c*' to isolate two adjacent fin-shaped structures 210*a*-210*b*. The dielectric layer 214*c*' may be referred to as an isolation feature 214*c*' or a shallow trench isolation (STI) feature 214*c*'. To substantially remove the sacrificial layer 206*b*, 206*m*, 206*t* in subsequent etching processes while providing satisfactory isolation between the two adjacent fin-shaped structures 210*a* and 210*b*, a top surface of the isolation feature 214*c*' is below or coplanar with a bottom surface of the sacrificial layer 206*b*. That is, a thickness T6 of the isolation feature 214*c*' is equal to or less than the thickness D1 of the mesa structure 202*t*'. In some embodiments, a ratio of the thickness T6 of the isolation feature 214*c*' to the thickness T1 of the channel layer 208*b*/208*m*/208*t* is between about 1 and 2. For example, T1 is between about 6 nm and about 10 nm, and T6 is between about 10 nm and about 15 nm. A distance D2 between the top surface of the isolation feature 214*c*' and the bottom surface of the sacrificial layer 206*b* may be between about 3 nm and about 5 nm.

Figure 7:
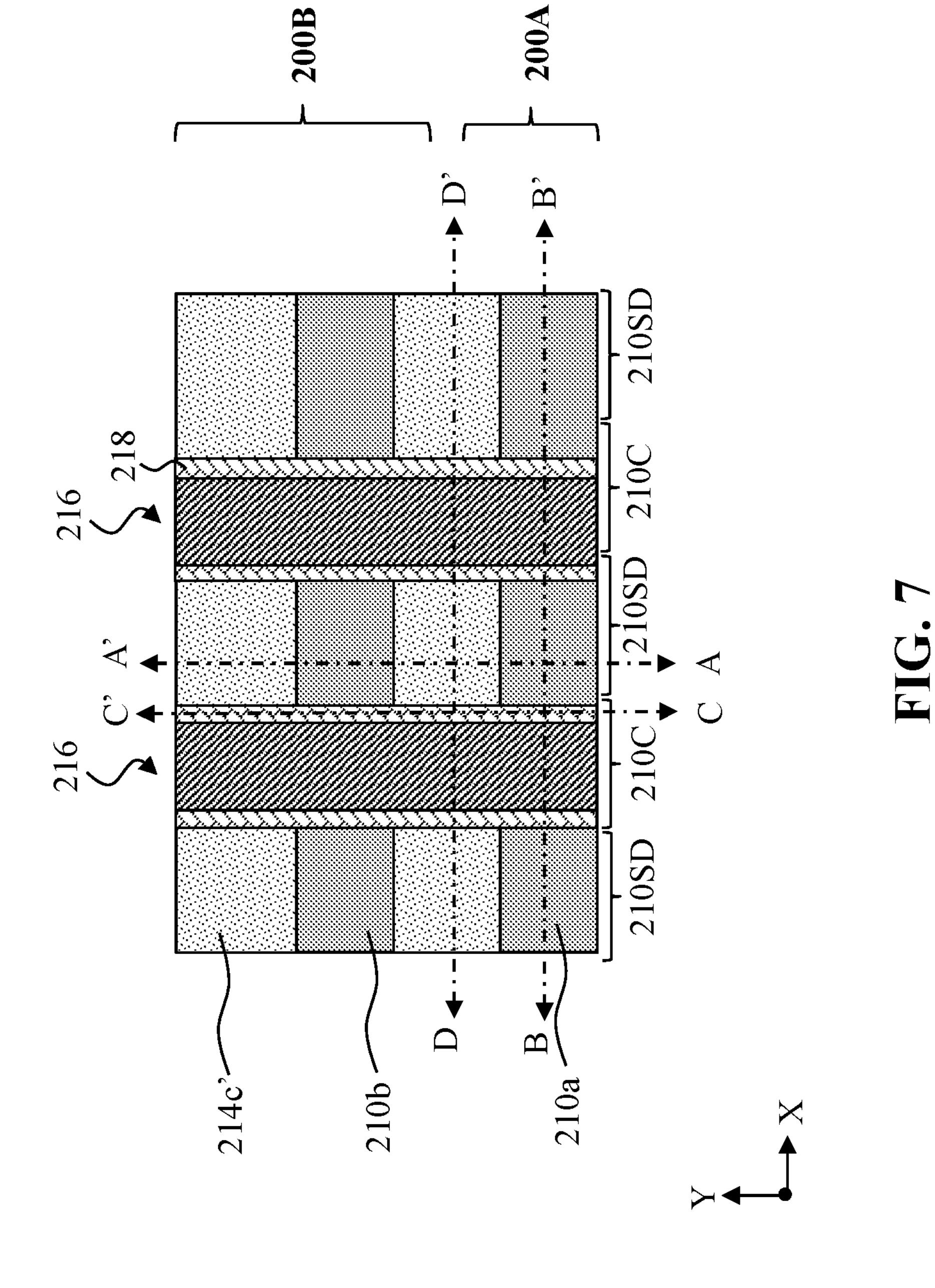
Figures 8A, 8B:
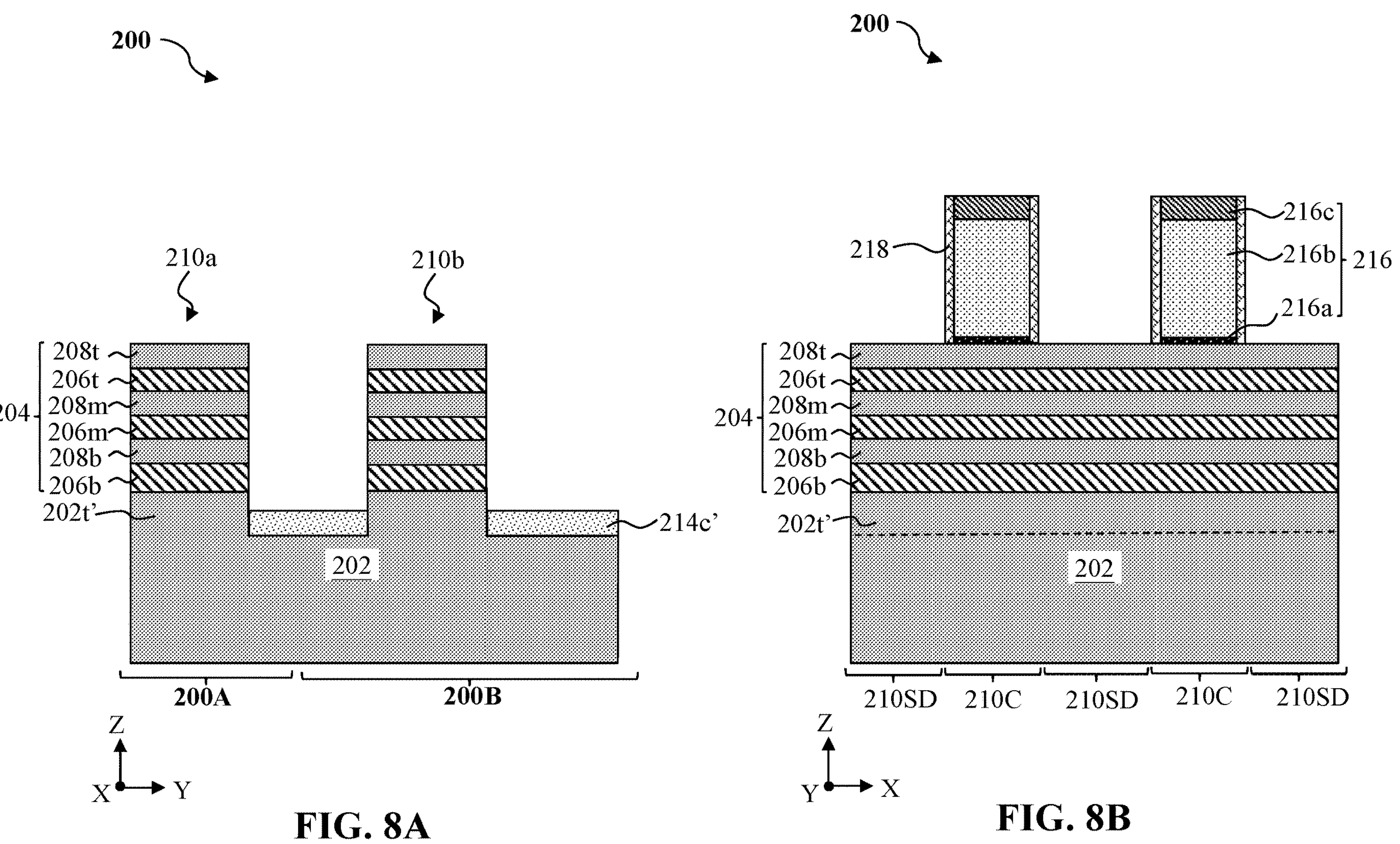
Figures 8C, 8D:
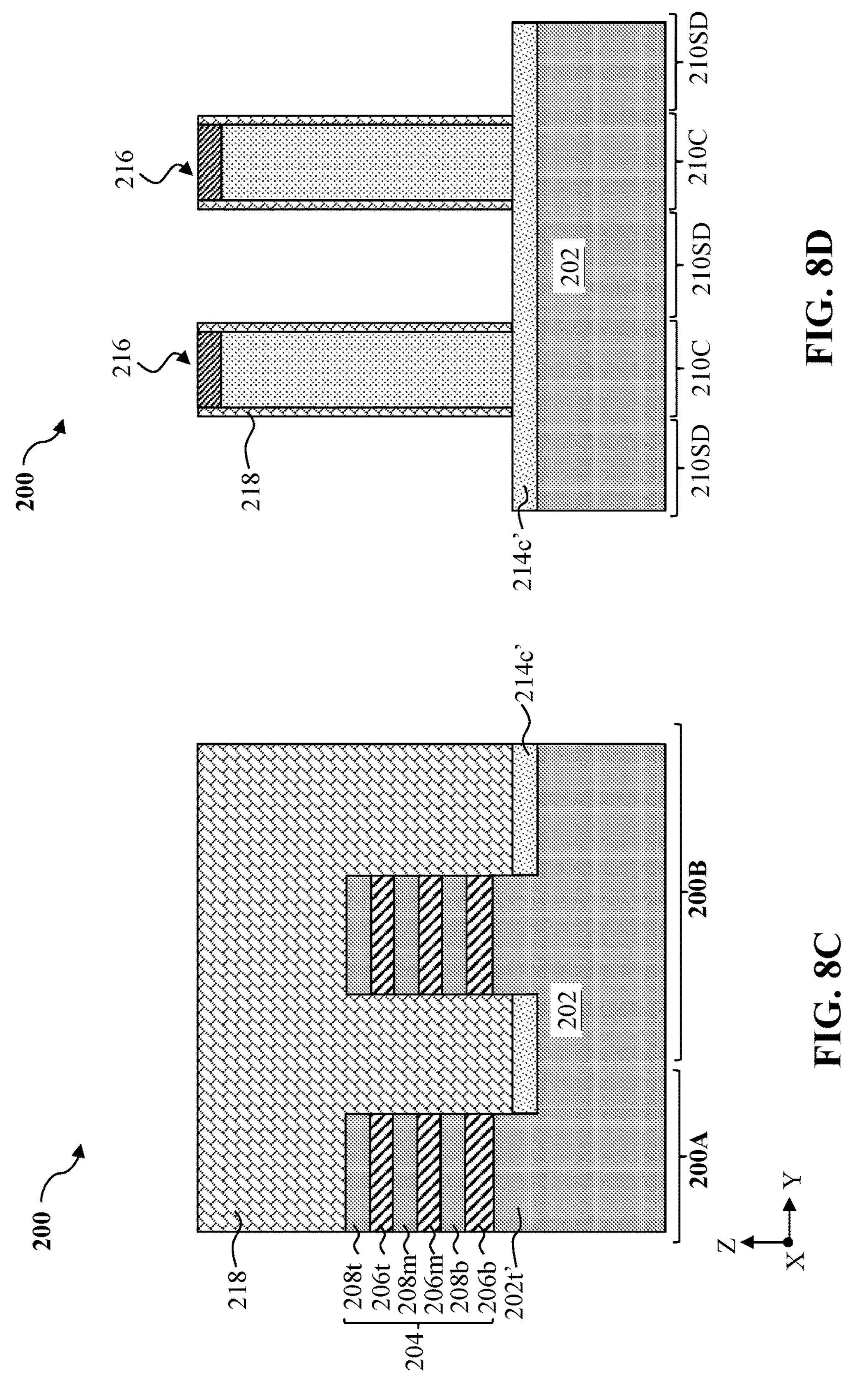
FIG. 8C illustrates a fragmentary cross-sectional view of the workpiece taken along line C-C' shown in FIG. 7, according to one or more aspects of the present disclosure.
FIG. 8D illustrates a fragmentary cross-sectional view of the workpiece taken along line D-D' shown in FIG. 7, according to one or more aspects of the present disclosure.

Referring to FIGS. 1, 7, and 8A-8B, method 100 includes a block 108 where dummy gate stacks 216 and gate spacers 218 are formed over the workpiece 200. FIG. 7 depicts a fragmentary top view of the workpiece 200 having the dummy gate stacks 216 and the gate spacers 218. FIGS. 8A-8D depict fragmentary cross-sectional views of the workpiece 200 taken along line A-A', B-B', C-C', and D-D' shown in FIG. 7, respectively. As shown in FIG. 7 and FIG. 8B, the dummy gate stacks 216 are formed over channel regions 210C of the fin-shaped structures 210*a*-210*b*. In this embodiment, a gate replacement process (or gate-last process) is adopted where one or more of the dummy gate stacks 216 serves as a placeholder for a functional gate structure. Other processes and configurations are possible. The dummy gate stacks 216 and the gate spacers 218 extends lengthwise along the Y direction. Each of the dummy gate stacks 216 and the gate spacers 218 has portions formed directly over the channel regions 210C of the fin-shaped structures 210*a*-210*b* and portions formed directly over the STI feature 214*c*', as represented in FIGS. 8A-8D.

Each of the dummy gate stacks 216 include a dummy dielectric layer 216*a* and a dummy electrode 216*b* disposed over the dummy dielectric layer 216*a*. In some embodiments, the dummy dielectric layer 216*a* may include silicon oxide and the dummy electrode 216*b* may include polycrystalline silicon (polysilicon). Each of the dummy gate stacks 216 also includes a gate-top hard mask layer 216*c* formed on the dummy electrode 216*b*. The gate-top hard mask layer 216*c* may include silicon nitride, silicon oxycarbonitride, silicon carbonitride, silicon oxide, silicon oxycarbide, silicon carbide, silicon oxynitride, and/or combinations thereof. After the dummy gate stacks 216 are formed, gate spacers 218 are formed along sidewalls of the dummy gate stacks 216. Dielectric materials for the gate spacers 218 may be selected to allow selective removal of the dummy gate stacks 216 without substantially damaging the gate spacers 218. The gate spacers 218 may include silicon nitride, silicon oxycarbonitride, silicon carbonitride, silicon oxide, silicon oxycarbide, silicon carbide, silicon oxynitride, and/or combinations thereof.

Figures 9A, 9B:
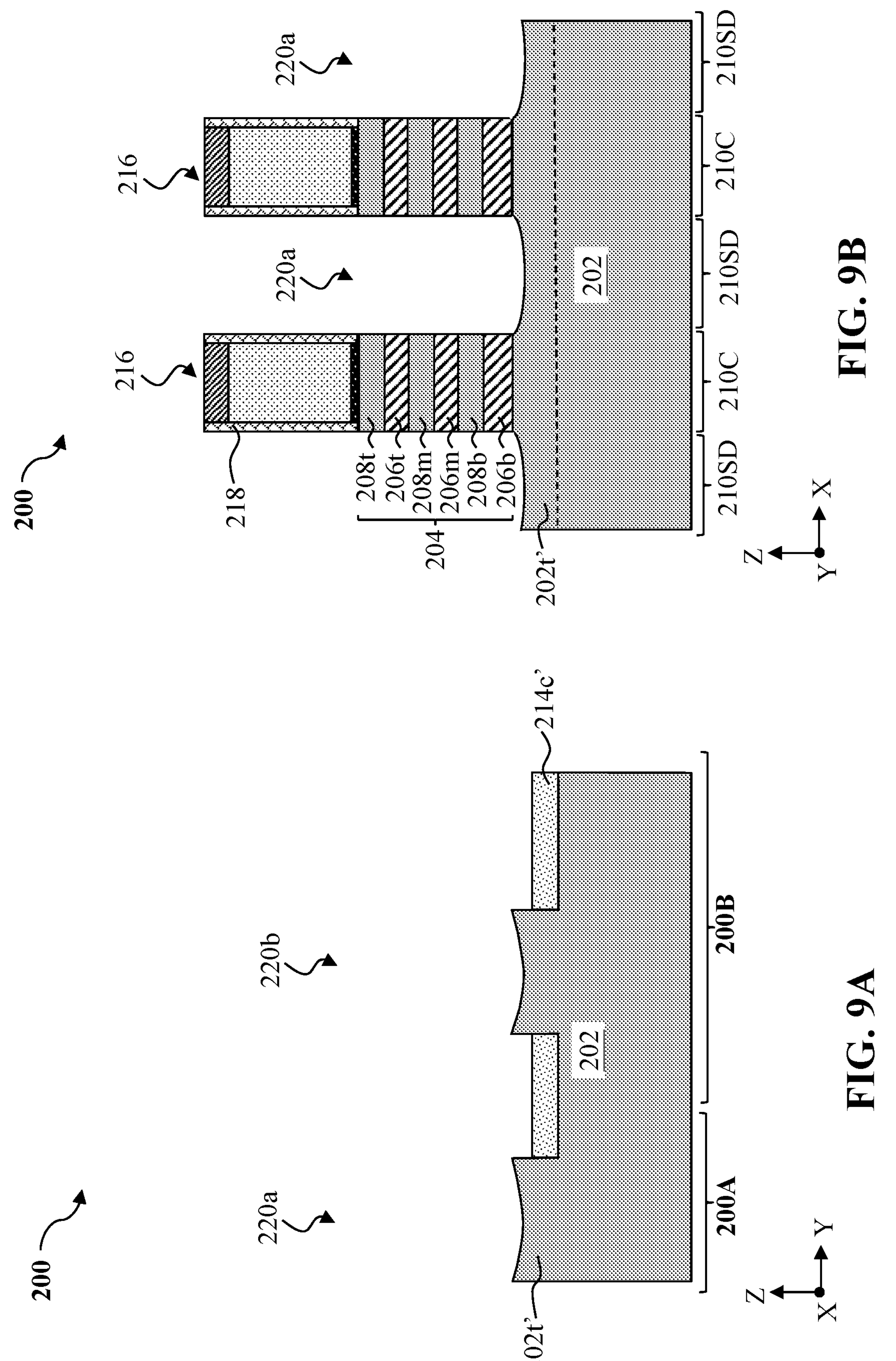

Referring to FIGS. 1 and 9A-9B, method 100 includes a block 110 where source/drain regions 210SD of the fin-shaped structures 210*a*-210*b* are recessed to form source/drain trenches 220*a* in the first region 200A and source/drain trenches 220*b* in the second region 200B. With the dummy gate stacks 216 and the gate spacers 218 serving as an etch mask, the workpiece 200 is anisotropically etched in the source/drain regions 210SD of the fin-shaped structures 210*a*-210*b* to form source/drain trenches 220*a* and source/drain trenches 220*b*. The anisotropic etch in block 110 may include a dry etching process and may implement hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. Source/drain trenches 220*a* and 220*b* may not only extend through the channel layers and sacrificial layers in the stack 204, but also extend into the mesa structures 202*t*'. In the present embodiments, after the performing of the anisotropic etch, each mesa structure 202*t*' has a concave top surface.

Figures 10A, 10B:
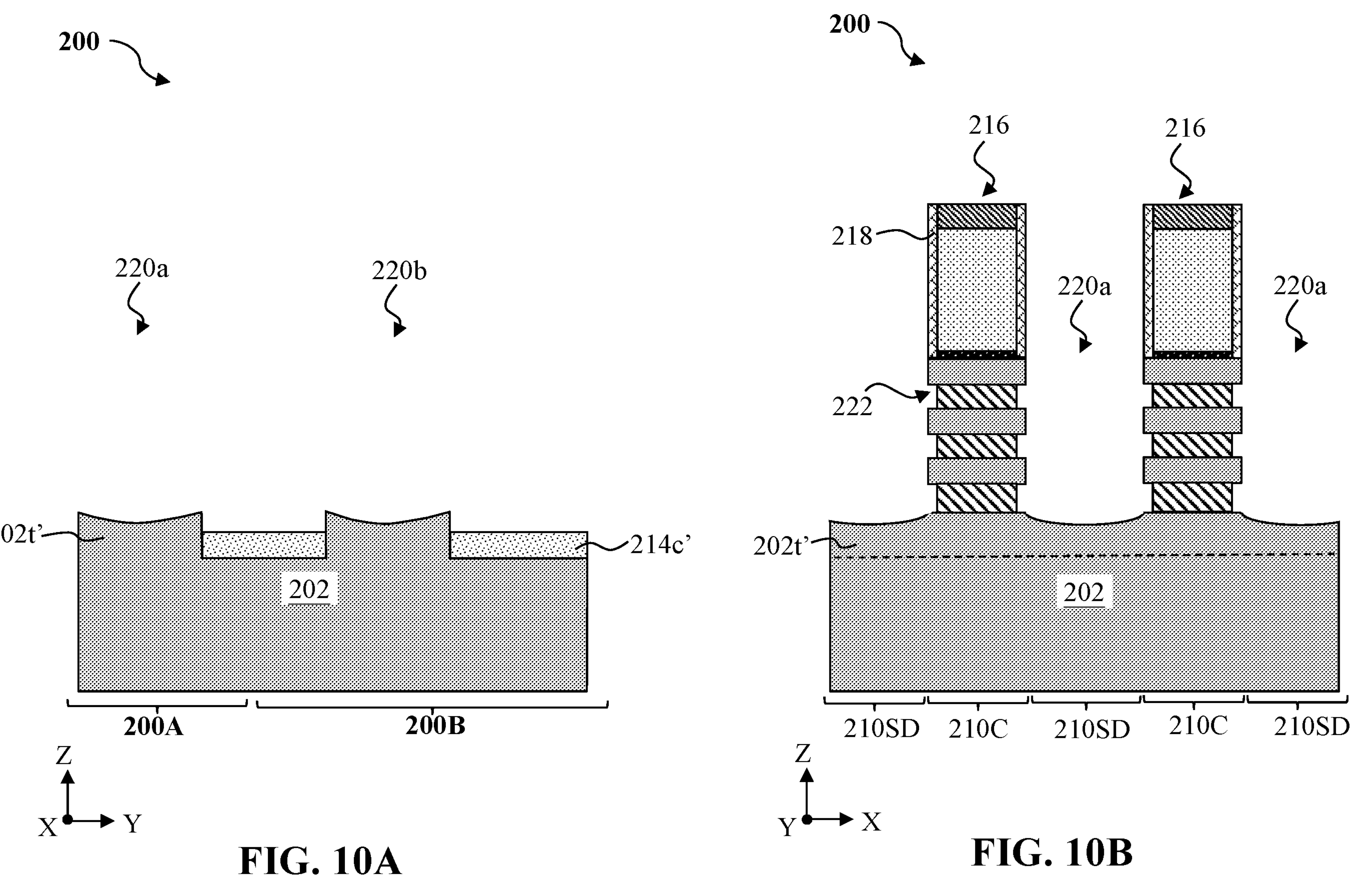
Figures 11A, 11B:
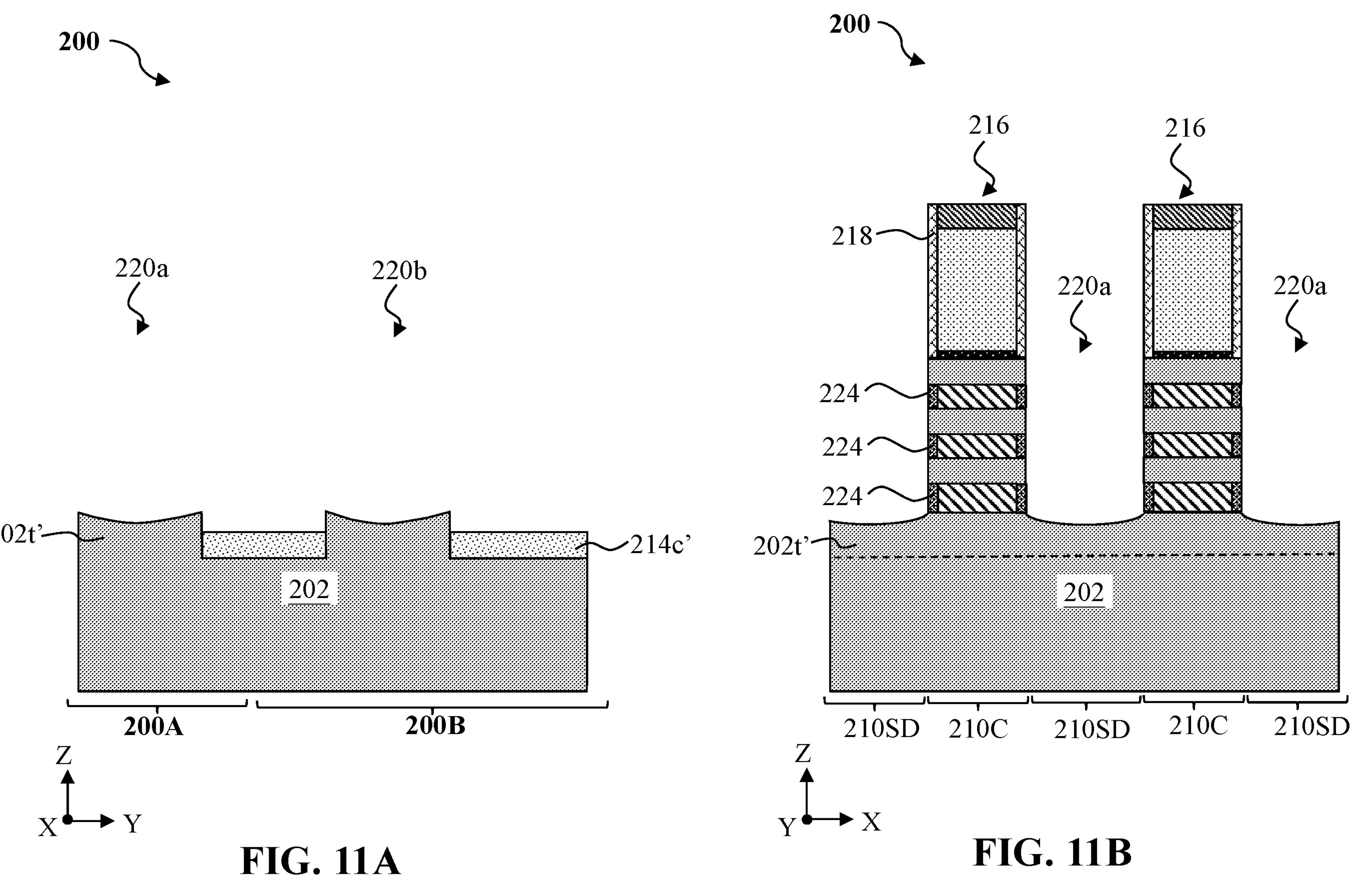
Figure 12:
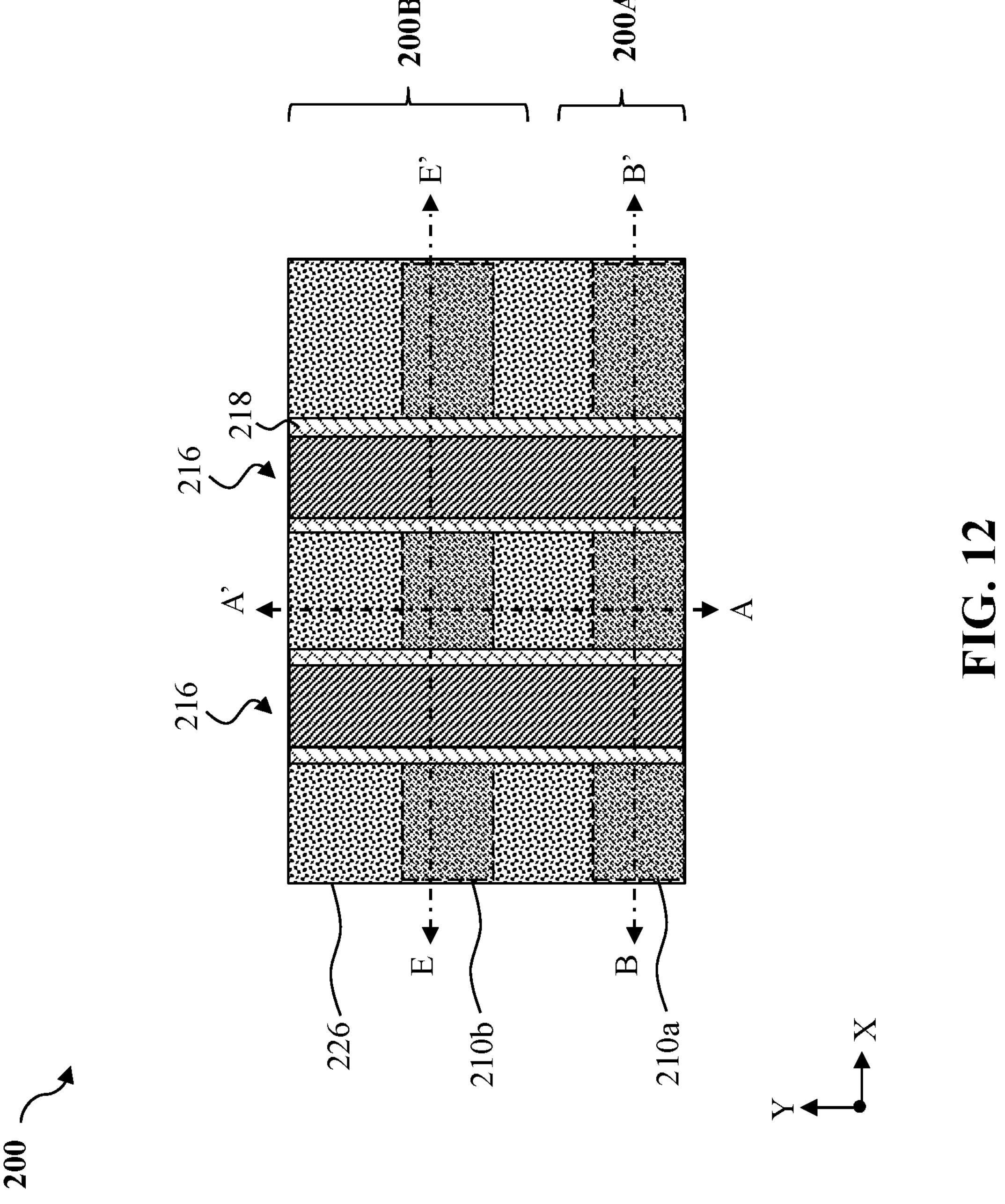

Referring to FIGS. 1, 10A-10B, and 11A-11B, method 100 includes a block 112 where inner spacer features 224 are formed. After forming the source/drain trenches 220*a* and 220*b*, as depicted in FIG. 10B, the sacrificial layers (e.g., sacrificial layers 206*b*, 206*m*, and 206*t*) exposed in the source/drain trenches 220*a* and 220*b* are selectively and partially recessed to form inner spacer recesses 222, while the exposed channel layers (e.g., channel layers 208*b*, 208*m*, and 208*t*) are substantially unetched. In some embodiments, this selective recess may include a selective isotropic etching process (e.g., a selective dry etching process or a selective wet etching process), and the extent at which the sacrificial layers is recessed is controlled by duration of the etching process. After the formation of the inner spacer recesses 222, an inner spacer material layer (not shown) is then conformally deposited using CVD or ALD over the workpiece 200, including over and into the inner spacer recesses 222. The inner spacer material may include silicon nitride, silicon oxycarbonitride, silicon carbonitride, silicon oxide, silicon oxycarbide, silicon carbide, or silicon oxynitride. After the deposition of the inner spacer material layer, the inner spacer material layer is etched back to form inner spacer features 224 in the inner spacer recesses 222, as depicted in FIG. 11B. In an embodiment, each inner spacer feature has a thickness ranged between about 3 nm and about 8 nm.

Referring to FIGS. 1, 12, and 13A-13B, method 100 includes a block 114 where bottom isolation layer 226 is formed over the workpiece 200. In an embodiment, the formation of the bottom isolation layers 226 are similar to the formation of the STI feature 214*c*'. For example, a dielectric material layer is deposited over the workpiece 200, including on the top surfaces of the dummy gate stacks 216, top surfaces of the substrate 202 exposed in the source/drain trenches 220*a*/220*b*, and along sidewall surfaces of the dummy gate stacks 216 and channel regions 210C of the fin-shaped structures 210*a*-210*b*. A planarization (e.g., CMP) process may be then performed to remove portions of the dielectric material layer on the top surfaces of the dummy gate stacks 216, and an etching process may be followed to remove portions of the dielectric material layer extending along sidewall surfaces of the dummy gate stacks 216 and channel regions 210C of the fin-shaped structures 210*a*-210*b*, thereby forming the bottom isolation layer 226. The STI feature 214*c*' may also be formed by an alternative method 500 described with reference to FIG. 29, and the bottom isolation layer 226 may also be formed by the method 500. In some embodiments, the STI feature 214*c*' and the bottom isolation layer 226 are formed by different methods. For example, the STI feature 214*c*' is formed by the method described with reference to FIGS. 5A-6B, and the bottom isolation layer 226 is formed by the method 500 described with reference to FIG. 29. The bottom isolation layer 226 may be formed of any suitable dielectric materials (e.g., low-k dielectric materials) as long as its composition is different from those of the channel layers and the sacrificial layers, gate spacers 218, and gate-top hard mask layer 216*c* to allow selective etch back by an etching process. In an embodiment, the bottom isolation layer 226 is a nitrogen-based dielectric layer and includes, for example, silicon nitride. The bottom isolation layer 226 may have a thickness that is less than the thickness T1 of the channel layer 208*t* and may be between about 3 nm and about 10 nm.

Figures 13A, 13B:
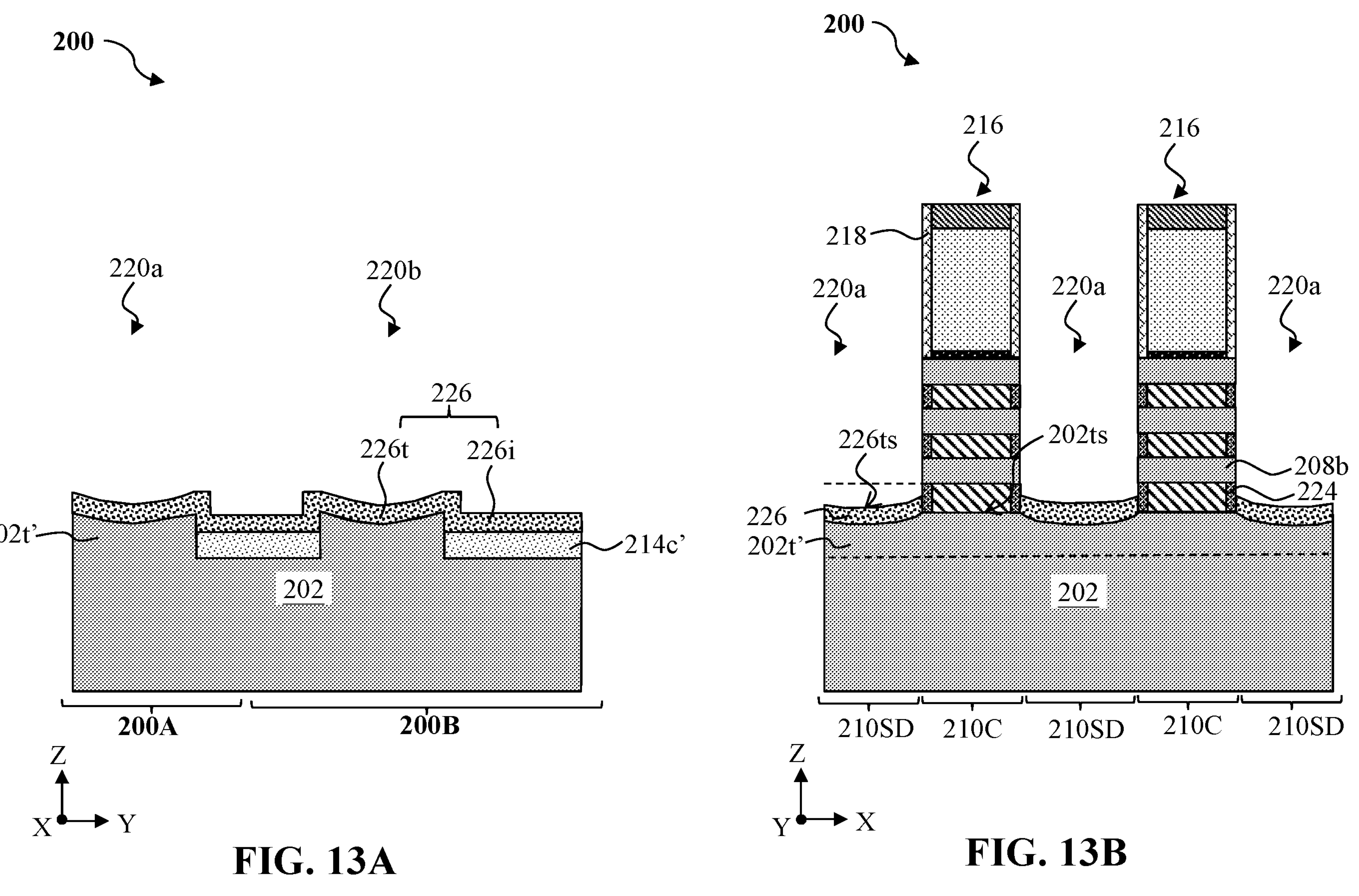

As depicted in FIG. 13A, the bottom isolation layer 226 includes a portion 226*t* formed on the mesa structures 202*t*' and in the source/drain trenches 220*a*/220*b* and a portion 226*i* formed on the STI feature 214*c*'. The bottom isolation layer 226 tracks the shape of the mesa structure 202*t*' and the shape of the STI feature 214*c*'. That is, the portion 226*t* of the bottom isolation layer 226 has a concave top surface, and the portion 226*i* of the bottom isolation layer has a substantially planar top surface. With reference to FIG. 13B, the bottom isolation layers 226 (e.g., the portion 226*t* of the bottom isolation layers 226) are formed in the source/drain trenches 220*a* and in direct contact with the substrate 202. To form the GAA transistor without forming the parasitic transistor formed among a gate structure 240 (shown in FIG. 22B), the mesa structure 202*t*', and epitaxial source/drain features (e.g., source/drain features 230P shown in FIG. 22B), a top surface 226*ts* of the portion 226*t* of each bottom isolation layer 226 is at least partially above a topmost surface 202*ts* of the mesa structure 202*t*' (e.g., a top surface of the portion of the mesa structure 202*t*' in the channel region 210C), and a sidewall surface of the portion 226*t* of the bottom isolation layer 226 is at least partially in direct contact with a sidewall surface of a bottommost inner spacer feature 224 disposed between the mesa structure 202*t*' and the bottommost channel layer 208*b*. In an embodiment, a height of a portion of the sidewall surface of the bottom isolation layer 226 that is overlapped with the bottommost inner spacer feature 224 is between about 5 nm and about 10 nm. In an embodiment, an entirety of the sidewall surface of the portion 226*t* of the bottom isolation layer 226 is in direct contact with the sidewall surface of the bottommost inner spacer feature 224. In addition, without substantially affecting the performance of the GAA transistors, the sidewall surface of the portion 226*t* of the bottom isolation layer 226 is free of contact with the bottommost channel layer 208*b*. In an embodiment, the bottom isolation layer 226 has a thickness ranged between about 3 nm and about 10 nm.

Figure 14:
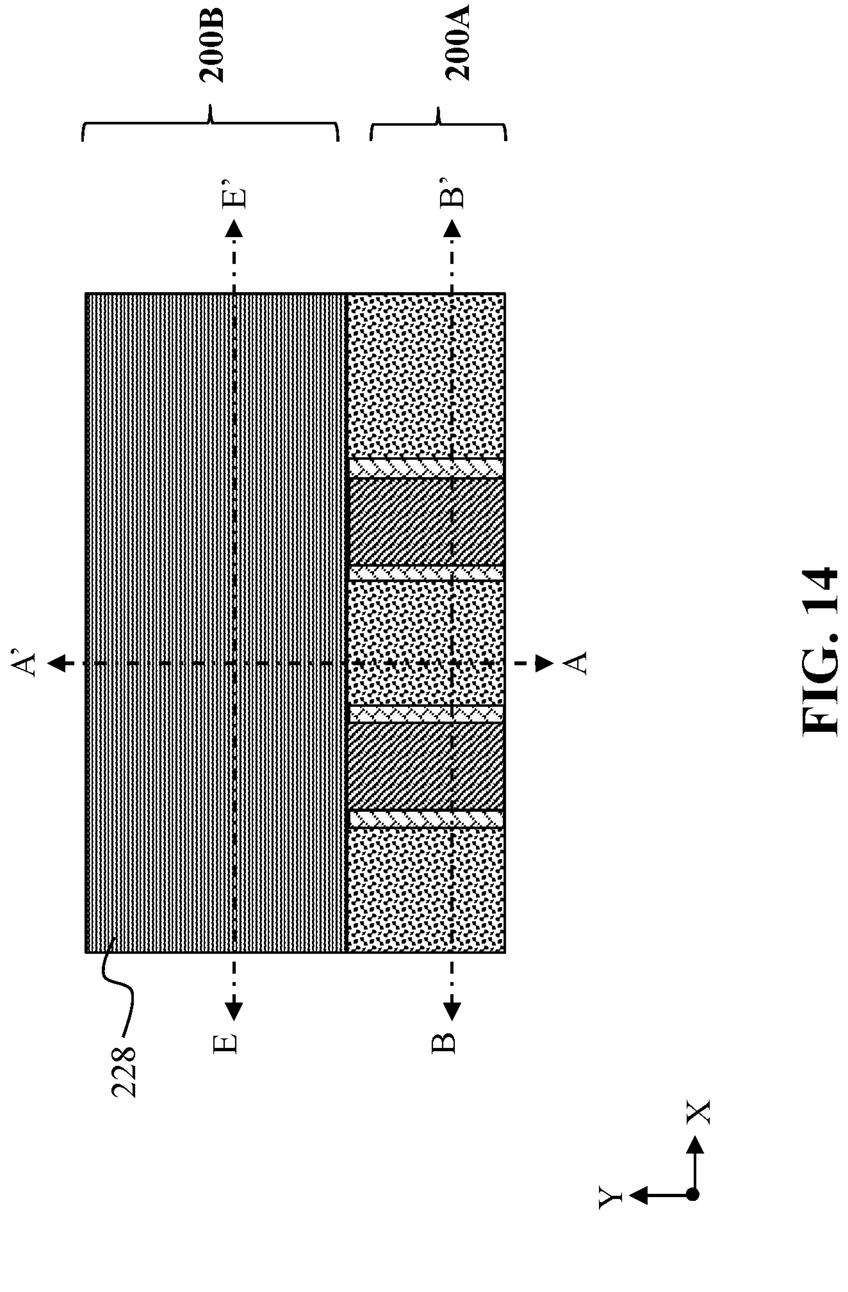
Figures 15A, 15B:
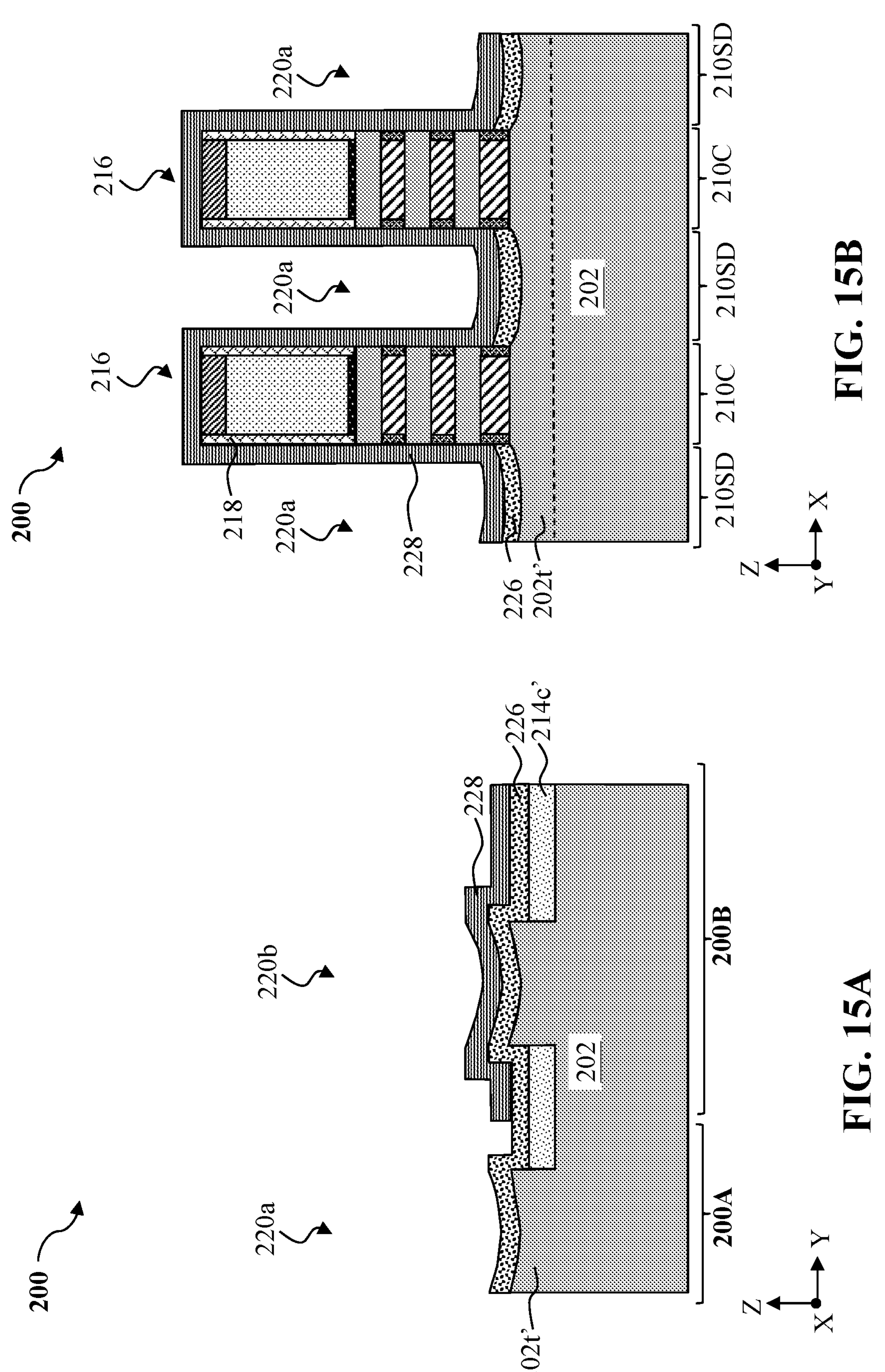
FIGS. 15B and 19B depict fragmentary cross-sectional views of the workpiece taken along line E-E' shown in FIG. 14 and FIG. 18, respectively, according to one or more aspects of the present disclosure.

Referring to FIGS. 1, 14, and 15A-15B, method 100 includes a block 116 where a first patterned mask layer 228 is formed over the second region 200B of the workpiece 200. A mask layer may be conformally deposited over the workpiece 200, including the first region 200A and the second region 200B. The mask layer may include any suitable materials, such as a metal-based oxide, so long as its composition is different from those of the channel layers and the sacrificial layers and the bottom isolation layers 226 to allow selective removal by an etching process. In an embodiment, the mask layer includes, for example, aluminum oxide ($Al_2O_3$). The mask layer is then patterned to remove a portion of the mask layer over the first region 200A, leaving a portion of the mask layer over the second region 200B. The patterned mask layer may be referred to as a first patterned mask layer 228. In some embodiments, to pattern the mask layer, a mask film (e.g., a bottom anti-reflective coating (BARC) layer) may be formed over the workpiece 200 using spin-on coating, flowable CVD (FCVD), or other suitable processes. The mask film is then patterned by a patterning process. The patterning process may include a lithography process (e.g., photolithography or e-beam lithography) which may include photoresist coating, soft baking, mask aligning, exposure, post-exposure baking, photoresist developing, rinsing, drying, other suitable lithography techniques, and/or combinations thereof. The patterned mask film may be then used to pattern the mask layer to form the first patterned mask layer 228, and after the formation of the first patterned mask layer 228, the patterned mask film may be selectively removed. FIG. 14 depicts a fragmentary top view of the workpiece 200 having the first patterned mask layer 228. FIGS. 15A-15B depict fragmentary cross-sectional views of the workpiece 200 taken along line A-A' and E-E' shown in FIG. 14, respectively. In the present embodiments, as depicted in FIGS. 14 and 15A-15B, the first patterned mask layer 228 covers, for example, exposed top and sidewall surfaces of the bottom isolation layers 226, exposed sidewall surfaces of the channel layers and sacrificial layer, exposed top and sidewall surfaces of the gate spacers 218, and exposed top surfaces of the dummy gate stacks 216 in the second region 200B while exposing, for example, the bottom isolation layers 226 and sidewall surfaces of the channel layers and sacrificial layer in the first region 200A.

Figure 16:
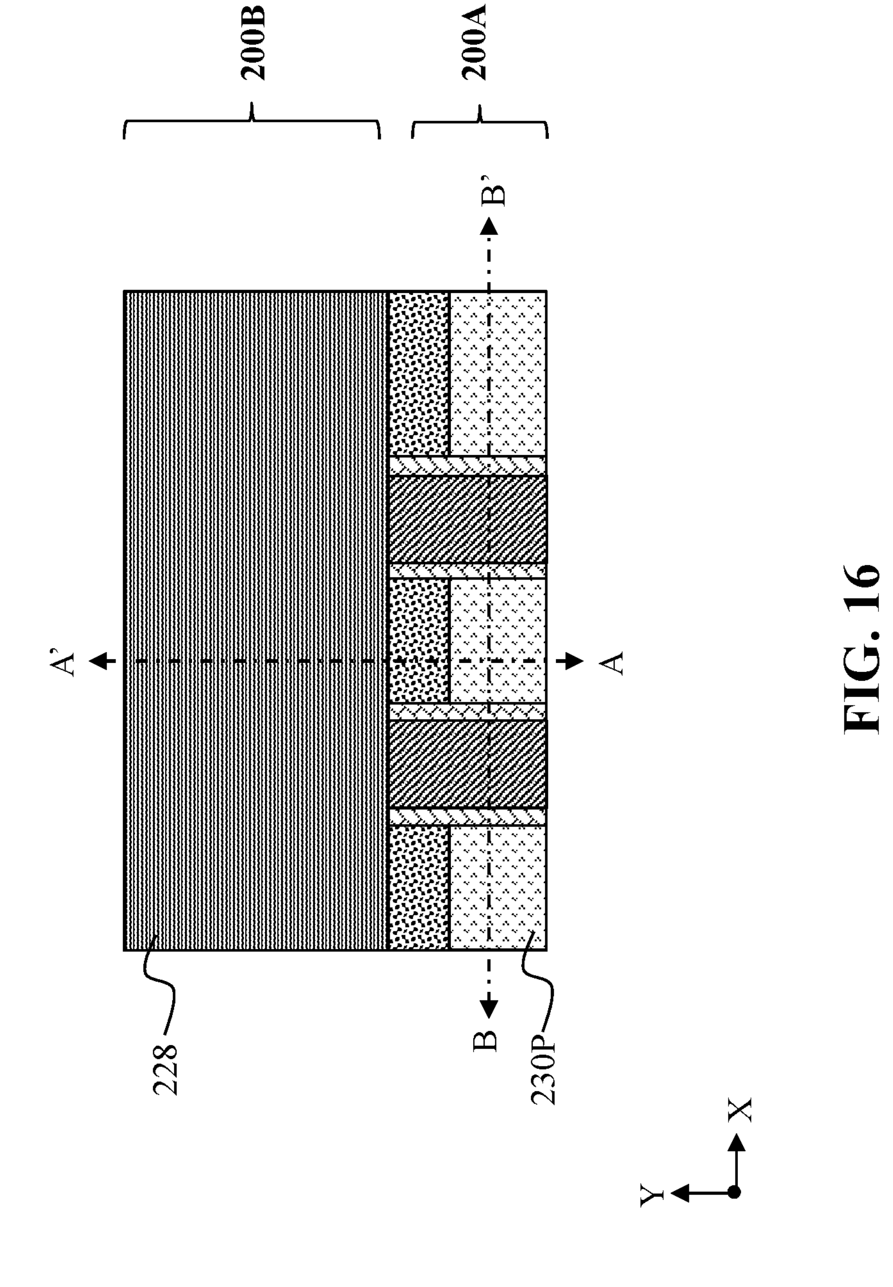
Figures 17A, 17B:
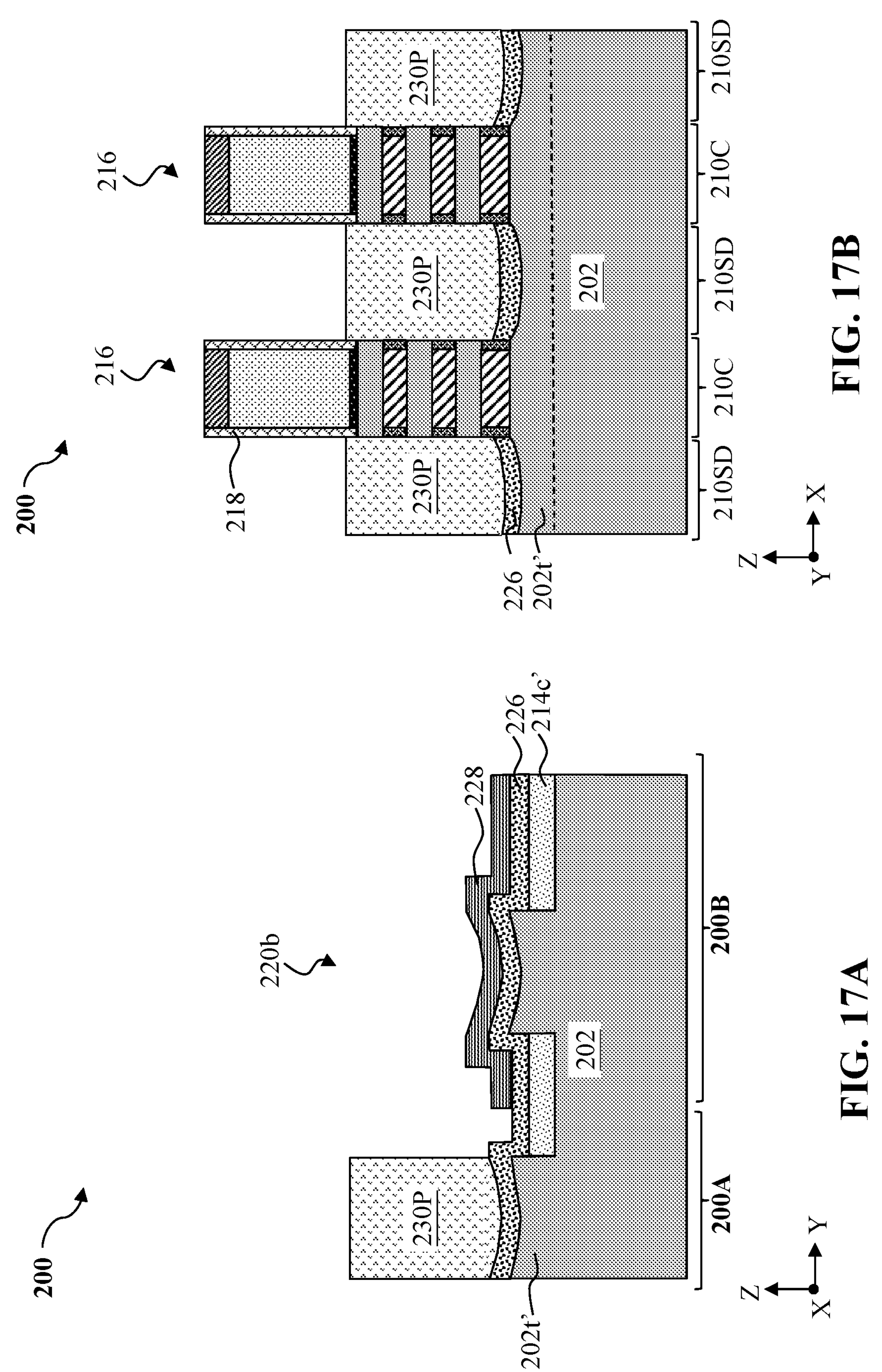

Referring to FIGS. 1, 16, and 17A-17B, method 100 includes a block 118 where p-type source/drain features 230P are formed in the first region 200A. FIG. 16 depicts a fragmentary top view of the workpiece 200 having the p-type source/drain features 230P. FIGS. 17A and 17B depict fragmentary cross-sectional views of the workpiece 200 taken along line A-A' and B-B' shown in FIG. 16, respectively. In the present embodiments, with the features in the second region 200B being covered by the first patterned mask layer 228, p-type source/drain features 230P are formed in source/drain trenches 220*a* in the first region 200A.

The p-type source/drain features 230P may be epitaxially and selectively formed exposed sidewalls of the channel layers 208*b*/208*m*/208*t* by using an epitaxial process, such as vapor phase epitaxy (VPE), ultrahigh-vacuum chemical vapor deposition (UHV-CVD), molecular-beam epitaxy (MBE), and/or other suitable processes. Since the exposed top surfaces of the substrate 202 in the first region 200A are covered by the bottom isolation layers 226, the p-type source/drain features 230P would not be epitaxially grown from the substrate 202. In an embodiment, the p-type source/drain features 230P track the shapes of the source/drain trenches 220*a* and each has a convex bottom surface. Each of the p-type source/drain features 230P is spaced apart from the substrate 202 by the bottom isolation layer 226 and is in direct contact with an entirety of the sidewall surface of the bottommost channel layer 208*b*. In some embodiments, each of the p-type source/drain features 230P is also in direct contact with a portion of the sidewall surface of the bottommost inner spacer feature 224. Since the p-type source/drain features 230P are spaced apart from the substrate 202 by the bottom isolation layer 226, the p-type source/drain features 230P may be free of an undoped semiconductor layer and only includes doped semiconductor layer(s). The p-type source/drain features 230P are coupled to the channel layers in the first region 200A and may include gallium-doped silicon germanium, boron-doped silicon germanium, or other suitable material and may be in-situ doped during the epitaxial process by introducing a p-type dopant, such as boron or gallium, or ex-situ doped using a junction implant process. The first patterned mask layer 228 may be selectively removed after forming the p-type source/drain features 230P.

Figure 18:
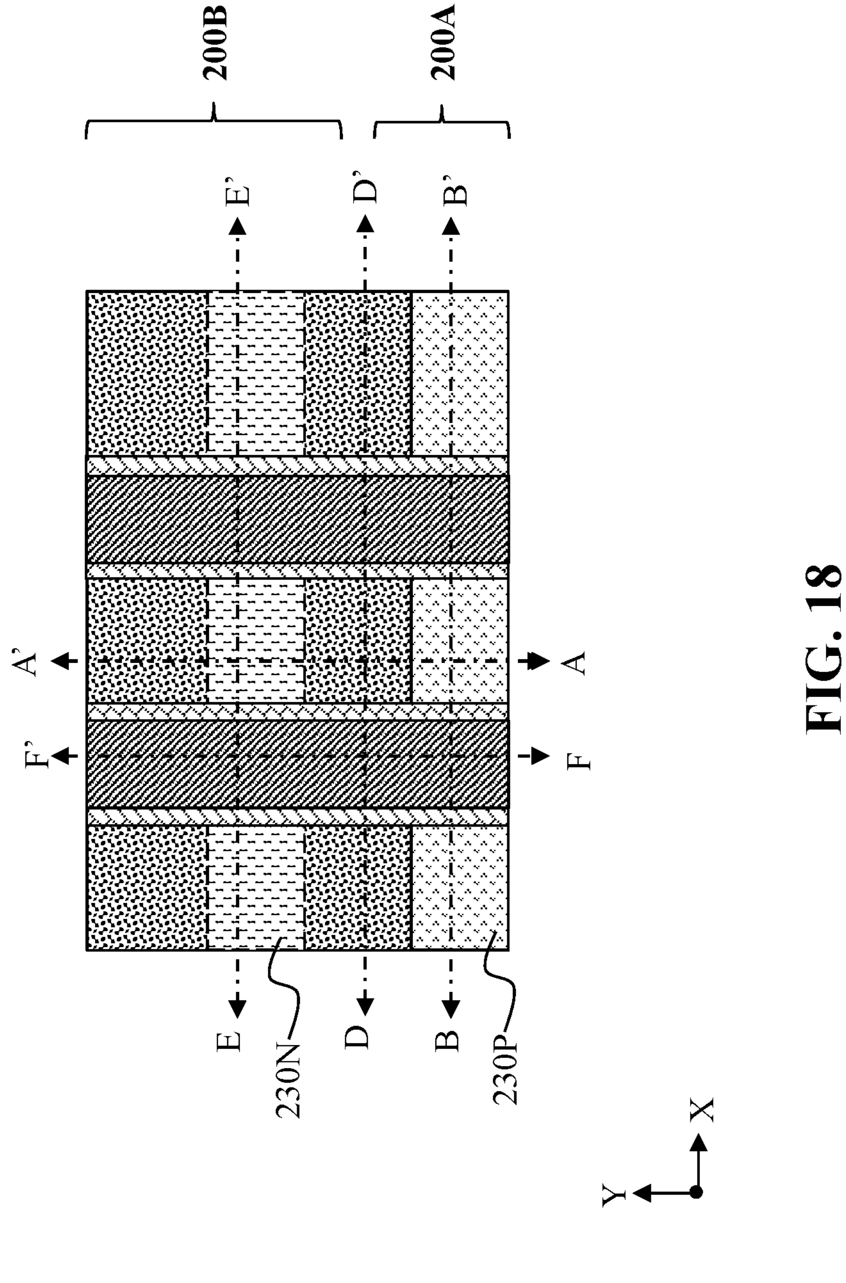
Figures 19A, 19B:
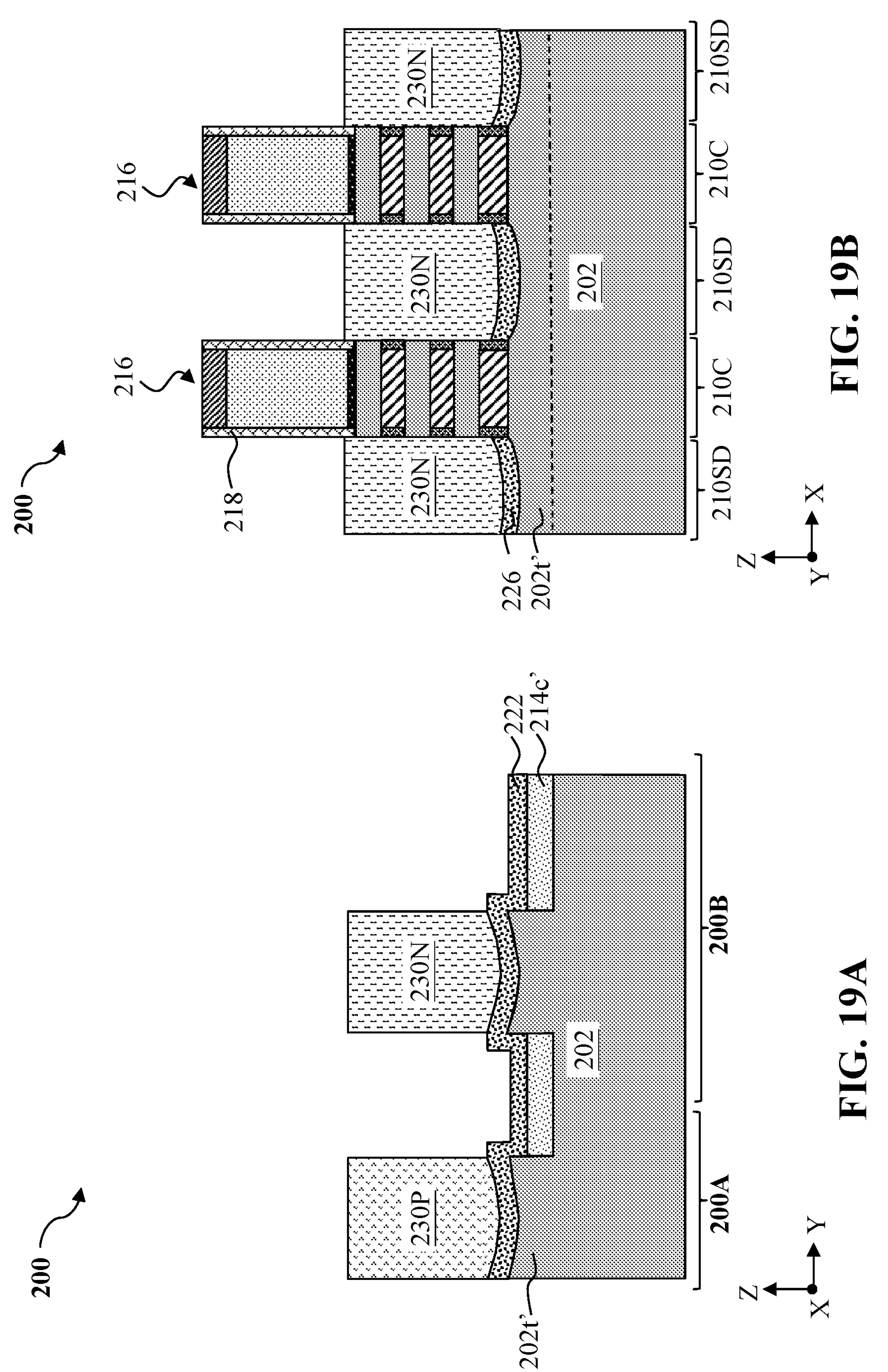

Referring to FIGS. 1, 18, and 19A-19B, method 100 includes a block 120 where n-type source/drain features 230N are formed in the second region 200B. FIG. 18 depicts a fragmentary top view of the workpiece 200 having the n-type source/drain features 230N. FIGS. 19A-19B depict fragmentary cross-sectional views of the workpiece 200 taken along line A-A' and E-E' shown in FIG. 18, respectively. After forming the p-type source/drain features 230P, a second patterned mask layer (not shown) may be formed over the first region 200A while the second region 200B. The composition and formation of the second patterned mask layer may be similar to those of the first patterned mask layer 228. For example, the second patterned mask layer may cover the p-type source/drain features 230P in the first region 200A and expose sidewall surfaces of the channel layers and sacrificial layers in the second region 200B. With the second patterned mask layer being formed over the first region 200A, n-type source/drain features 230N are formed in source/drain trenches 220*b* in the second region 200B.

The n-type source/drain features 230N may be epitaxially and selectively formed from exposed sidewalls of the channel layers 208*b*/208*m*/208*t* by using an epitaxial process, such as vapor phase epitaxy (VPE), ultrahigh-vacuum chemical vapor deposition (UHV-CVD), molecular-beam epitaxy (MBE), and/or other suitable processes. Since the exposed top surfaces of the substrate 202 in the second region 200B are covered by the bottom isolation layers 226, the n-type source/drain features 230N would not be epitaxially and selectively formed from the substrate 202. In an embodiment, the n-type source/drain features 230N track the shapes of the source/drain trenches 220*b* and each has a convex bottom surface. Each of the n-type source/drain features 230N is spaced apart from the substrate 202 by the bottom isolation layer 226 and is in direct contact with an entirety of the sidewall surface of the bottommost channel layer 208*b*. In some embodiments, each of the n-type source/drain features 230N is also in direct contact with a portion of the sidewall surface of the bottommost inner spacer feature 224. Since the n-type source/drain features 230N are spaced apart from the substrate 202 by the bottom isolation layer 226, the n-type source/drain features 230N may be free of an undoped semiconductor layer and only includes doped semiconductor layer(s). The n-type source/drain features 230N are coupled to the channel layers 208*b*/208*m*/208*t* in the first region 200A and may include phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. The second patterned mask layer may be selectively removed after forming the n-type source/drain features 230N.

Figures 20A, 20B:
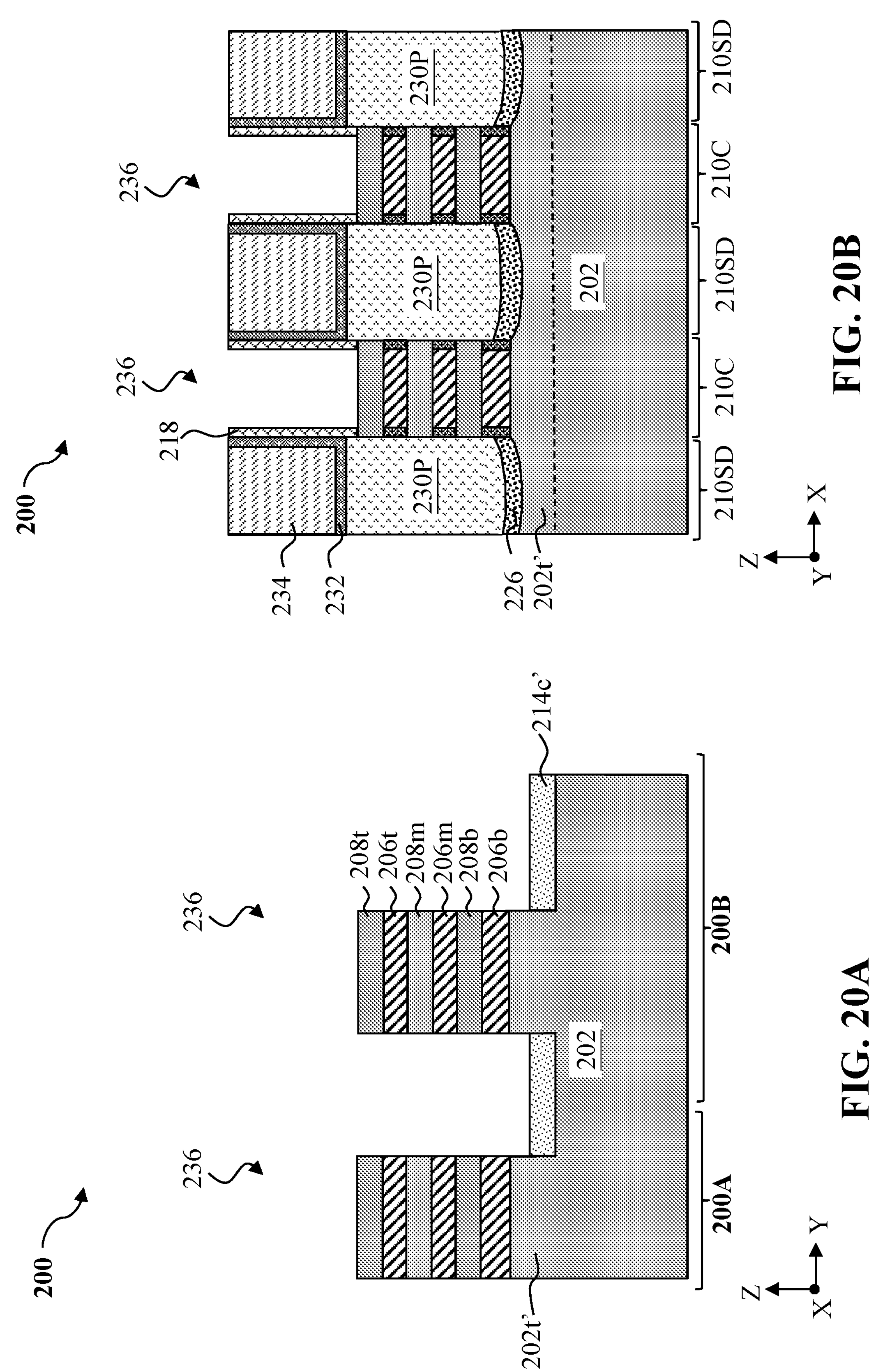
FIGS. 20A, 21A, and 22A depict fragmentary cross-sectional views of the workpiece taken along line F-F' shown in FIG. 18 during various fabrication stages in the method of FIG. 1, according to one or more aspects of the present disclosure.
Figure 20C:
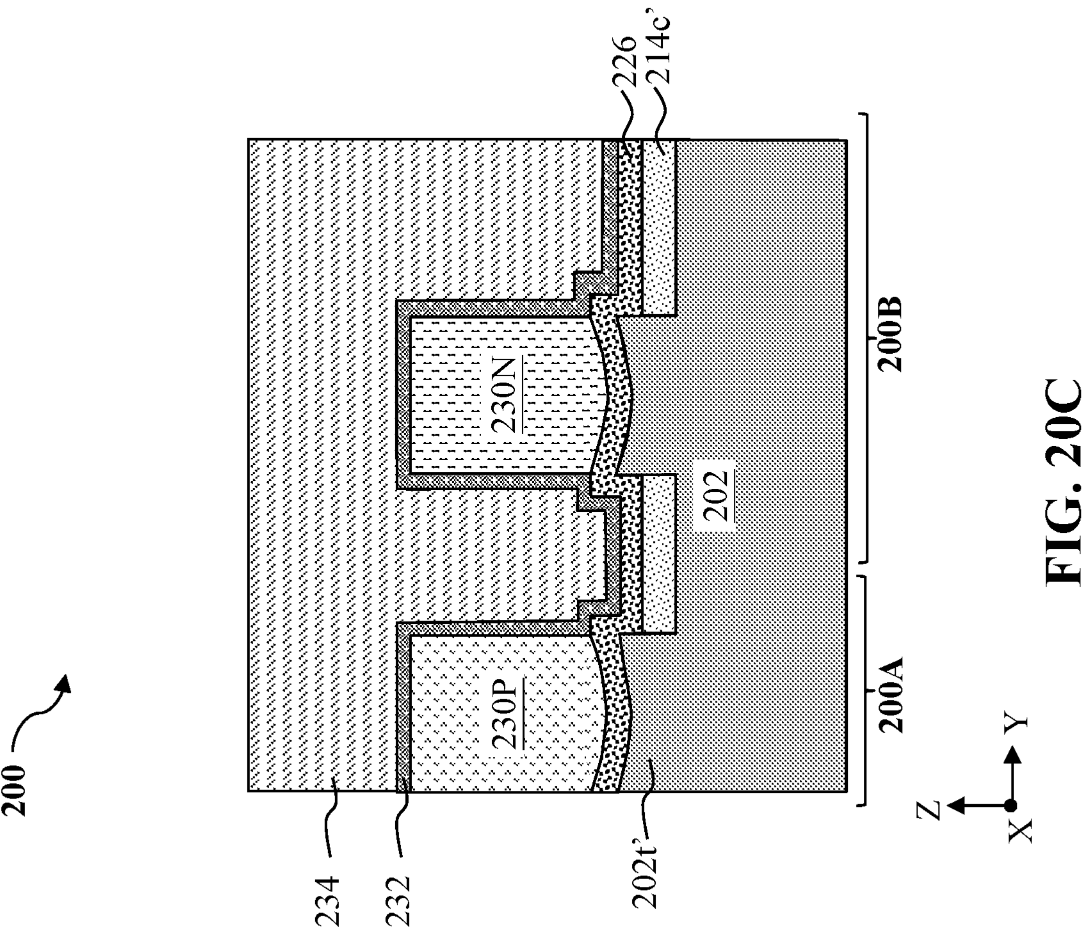

Referring to FIGS. 1 and 20A-20C, method 100 includes a block 122 where the dummy gate stacks 216 are selectively removed. FIG. 20A depicts a fragmentary cross-sectional view of the workpiece 200 taken along line F-F' shown in FIG. 18 after the dummy gate stacks 216 are selectively removed, FIG. 20B depicts a fragmentary cross-sectional view of the workpiece 200 taken along line B-B' shown in FIG. 18 after the dummy gate stacks 216 are selectively removed. FIG. 20C depicts a fragmentary cross-sectional view of the workpiece 200 taken along line A-A' shown in FIG. 18 after the dummy gate stacks 216 are selectively removed. After forming the source/drain features 230N and 230P, a contact etch stop layer (CESL) 232 and an interlayer dielectric (ILD) layer 234 are deposited over the workpiece 200. The CESL 232 may include silicon nitride, silicon oxynitride, and/or other suitable materials and may be formed by atomic layer deposition (ALD), plasma-enhanced chemical vapor deposition (PECVD) process and/or other suitable deposition or oxidation processes. The ILD layer 234 is deposited by a PECVD process or other suitable deposition technique over the workpiece 200 after the deposition of the CESL 232. The ILD layer may include silicon oxide, tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. A planarization process may be then performed to remove excess materials such as removing the gate-top hard mask layer 216*c* in the dummy gate stack 216 and portions of the CESL 232 and the ILD layer 234 over the gate-top hard mask layer 216*c*. With reference to FIG. 20C, the CESL 232 is in direct contact with the source/drain features 230P and 230N and the bottom isolation layer 226. It is understood that the profiles of the source/drain features 230P and 230N are just an example and are not intended to limit the present disclosure to what is explicitly illustrated therein. The profiles of the source/drain features 230P and/or the source/drain features 230N may be adjusted as needed.

Subsequently, still referring to FIGS. 20A-20C, the dummy gate stacks 216 are selectively removed. The removal of the dummy gate stacks 216 forms gate trenches 236 over the channel region 210C and over the STI feature 214*c*'. The etching process may include any suitable process, such as a dry etching process, a wet etching process, or combinations thereof, and is configured to selectively remove the dummy gate stacks 216 without substantially etching the STI feature 214*c*', the channel layers and sacrificial layers, the gate spacer 218, the CESL 232, and the ILD layer 234.

Figures 21A, 21B:
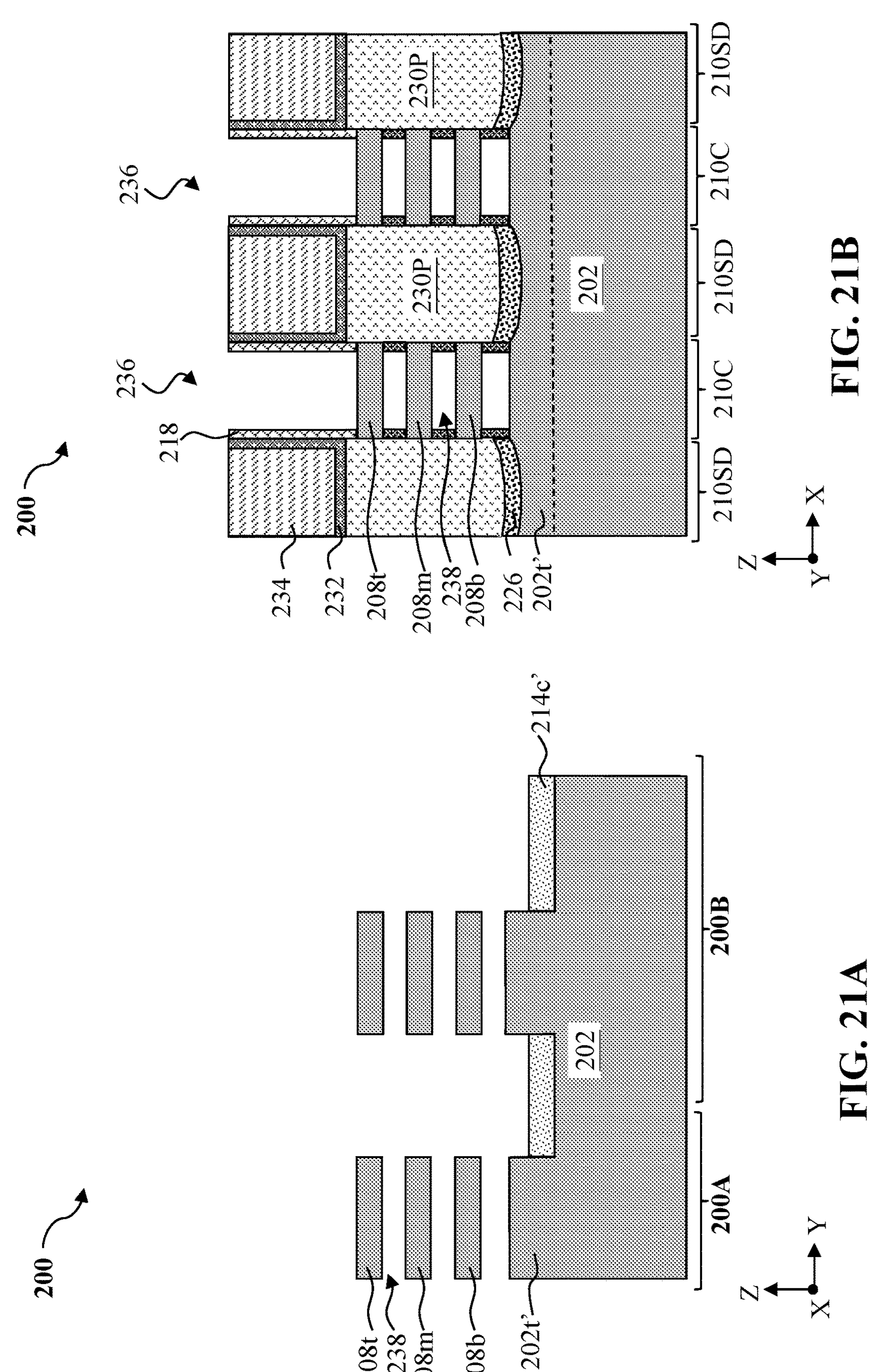

Referring to FIGS. 1 and 21A-21B, method 100 includes a block 124 where the sacrificial layers 206*b*, 206*m*, and 206*t* are selectively removed. After the selective removal of the dummy gate stacks 216, the sacrificial layers 206*b*, 206*m*, and 206*t* are selectively removed to form a number of openings 238 interleaved with the channel layers 208*b*, 208*m*, and 208*t* without substantially removing the channel layers 208*b*, 208*m*, and 208*t*, the inner spacer features 224, and the STI feature 214*c*'. In one example, a wet etching process employing an oxidant such as ammonium hydroxide ($NH_4OH$), ozone ($O_3$), nitric acid ($HNO_3$), hydrogen peroxide ($H_2O_2$), other suitable oxidants, and a fluorine-based etchant such as hydrofluoric acid (HF), ammonium fluoride ($NH_4F$), other suitable etchants, or combinations thereof may be performed to selectively remove the sacrificial layers 206*b*, 206*m*, and 206*t* to release the channel layers 208*b*, 208*m*, and 208*t* as channel members 208*b*, 208*m*, and 208*t*.

Figures 22A, 22B:
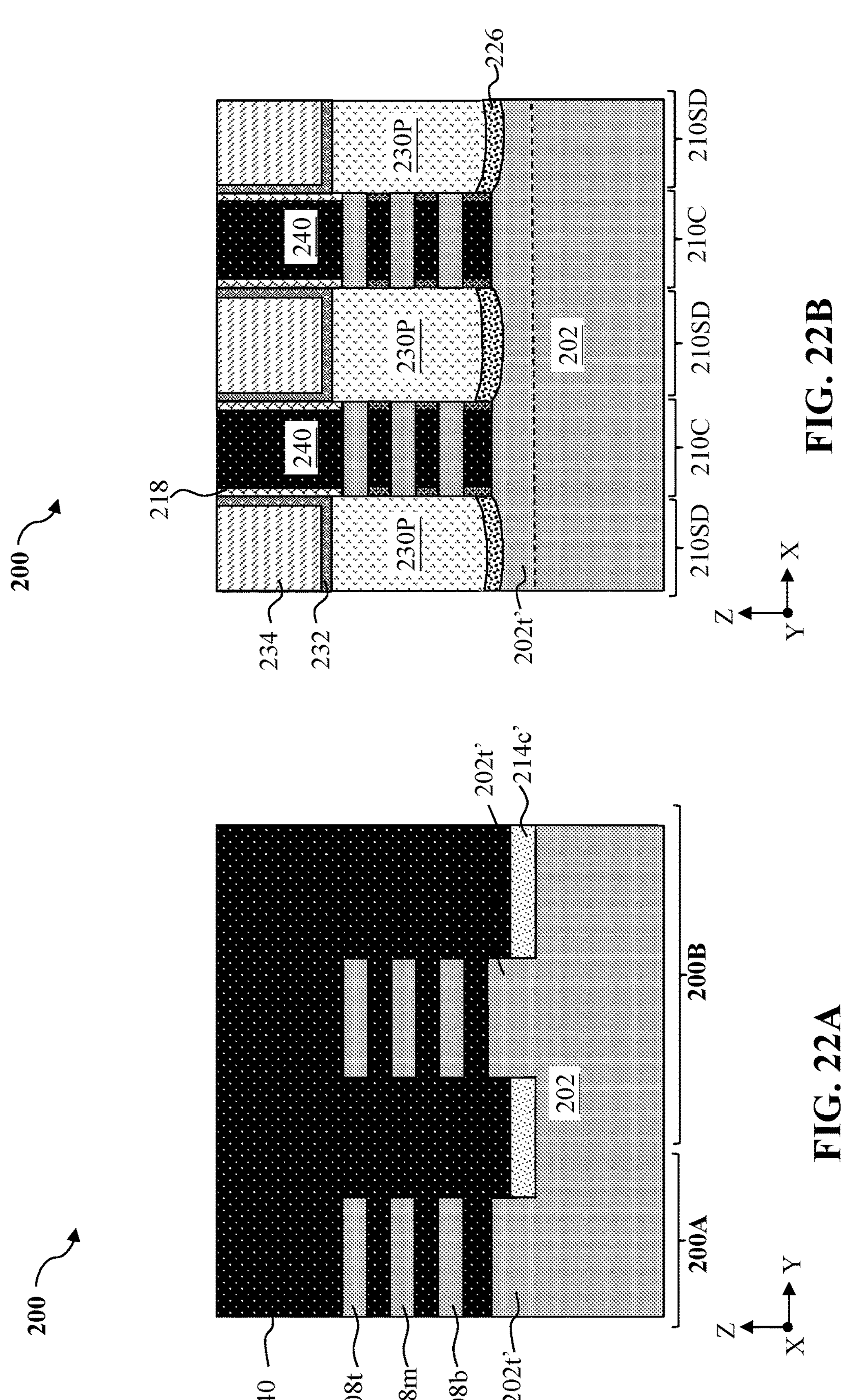
Figure 23:
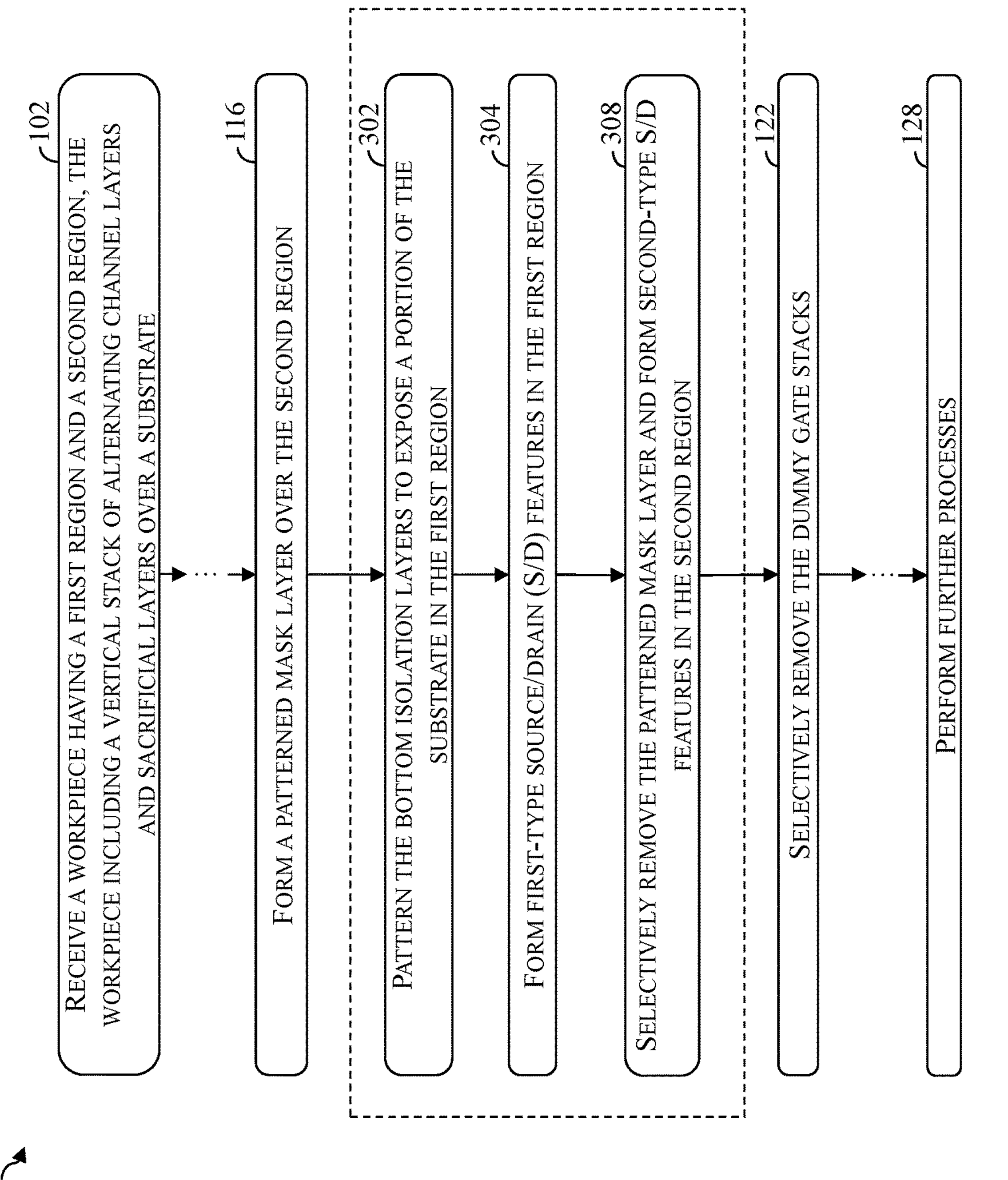
FIG. 23 illustrates a flowchart of an alternative method for fabricating another semiconductor structure, according to various embodiments of the present disclosure.
Figures 24A, 24B:
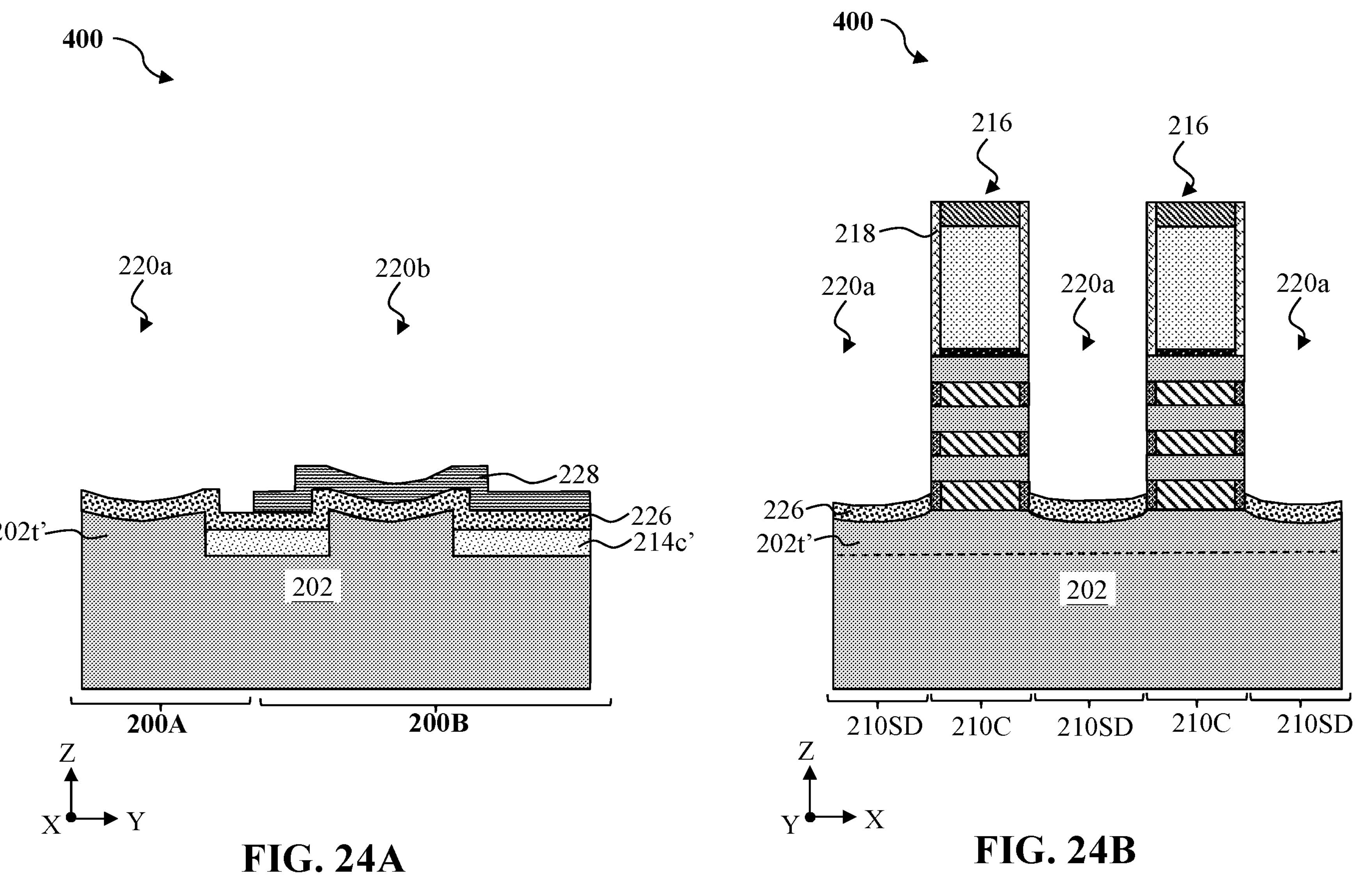
FIGS. 24A, 25A, 26A, 27A, and 28A illustrate fragmentary cross-sectional views of an exemplary workpiece taken along line A-A' shown in FIG. 12 during various fabrication stages in the method of FIG. 23, according to one or more aspects of the present disclosure.
FIGS. 24B, 25B, and 26B illustrate fragmentary cross-sectional views of an exemplary workpiece taken along line B-B' shown in FIG. 12 during various fabrication stages in the method of FIG. 23, according to one or more aspects of the present disclosure.

Referring to FIGS. 1 and 22A-22B, method 100 includes a block 126 where gate structures 240 are formed in the openings 238 and the gate trench 236 to wrap around and over the channel layers 208*b*, 208*m*, and 208*t*. The gate structures 240 may include an interfacial layer (not separately labeled), a gate dielectric layer (not separately labeled) over the interfacial layer, and a gate electrode layer (not separately labeled) over the gate dielectric layer. In some embodiments, the interfacial layer may include silicon oxide formed by thermal oxidization. The gate dielectric layer is then deposited over the interfacial layer using ALD, CVD, and/or other suitable methods. The gate dielectric layer may include high-k dielectric materials. As used herein, high-k dielectric materials include dielectric materials having a high dielectric constant, for example, greater than that of thermal silicon oxide (~3.9). In one embodiment, the gate dielectric layer may include hafnium oxide. Alternatively, the gate dielectric layer may include other high-k dielectrics, such as titanium oxide ($TiO_2$), hafnium zirconium oxide (HfZrO), tantalum oxide ($Ta_2Os$), hafnium silicon oxide ($HfSiO_4$), zirconium oxide, zirconium silicon oxide ($ZrSiO_2$), lanthanum oxide ($La_2O_3$), aluminum oxide ($Al_2O_3$), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr) $TiO_3$ (BST), silicon nitride (SiN), silicon oxynitride (SiON), combinations thereof, or other suitable material. A gate electrode layer is deposited over the gate dielectric layer. The gate electrode layer may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. In various embodiments, a planarization process, such as a CMP process, may be performed to remove excess portions of those materials to provide a substantially planar top surface of the gate structures 240. In some embodiments, a first gate structure is formed to wrap around each of the channel members in the first region 200A and a second gate structure is formed to wrap around each of the channel members in the second region 200B, and a composition of the first gate structure is different than a composition of the second gate structure.

Referring to FIG. 1, method 100 includes a block 128 where further processes are performed to complete the fabrication of the semiconductor structure 200. For example, method 100 may further include recessing the gate structures 240, forming dielectric capping layers over the recessed gate structures 240. Such further processes may also include forming gate isolation features to cut the recessed gate structures 240 into portions. The gate isolation features may extend lengthwise along a direction (e.g., X direction) that is substantially perpendicular to the lengthwise direction of the gate structures 240. Such further processes may also include forming silicide layers on the source/drain features and forming gate contacts over the gate structures and source/drain contacts over the source/drain features. Such further processes may also include forming an interconnect structure configured to connect the various features to form a functional circuit that includes the different semiconductor structures. The interconnect structure may include multiple interlayer dielectric (ILD) layers and multiple metal lines, contact vias, and/or power rails in each of the ILD layers. The metal lines, contact vias, and/or power rails in each ILD layer may be formed of metal, such as aluminum, tungsten, ruthenium, or copper.

Figures 25A, 25B:
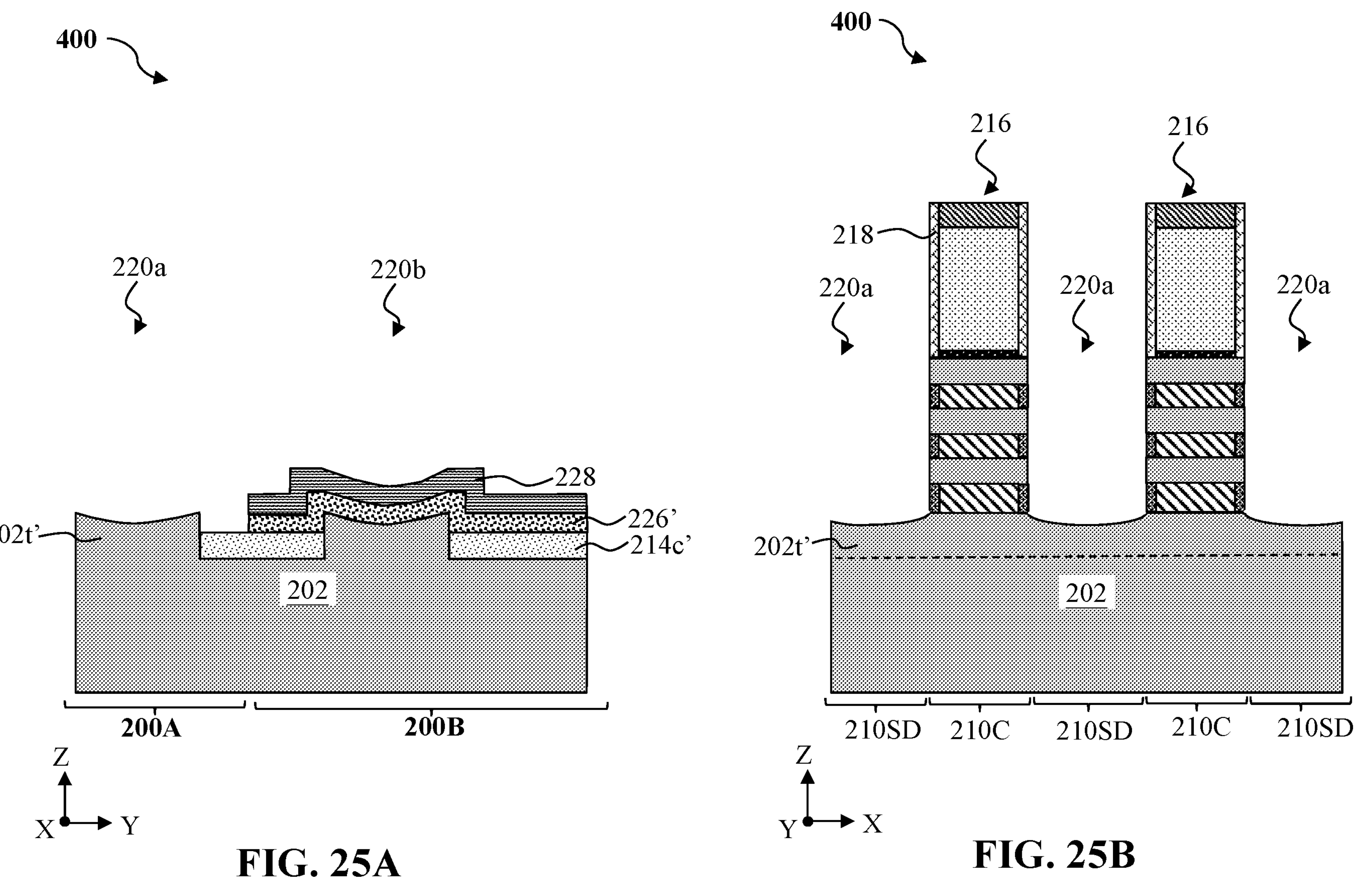

In the above embodiments, both transistors in the first region 200A and the transistors in the second region 200B include the bottom isolation layer 226. In some alternative embodiments, to fulfill different electrical performance requirements for n-type GAA transistors and p-type GAA transistors, one of the transistors in the first region 200A and the transistors in the second region 200B may be free of the bottom isolation layers 226. For example, in embodiments described with reference to FIG. 23, FIGS. 24A-28A and FIGS. 24B-28B, a semiconductor structure 400 is formed to have the bottom isolation layer 226 only in the second region 200B. FIG. 23 depicts a method 300 of forming the semiconductor structure 400, and FIGS. 24A-28A and 24B-28B depict fragmentary cross-sectional views of the semiconductor structure 400. As depicted in FIG. 23, method 300 is similar to the method 100. The differences between the method 100 and method 300 includes, after performing the operations in blocks 102, 104, 106, 108, 110, 112, 114, and 116 described with reference to FIG. 1, method 300 proceeds to block 302, where the bottom isolation layers 226 are patterned to expose a portion of the substrate 202 in the first region 200A. More specifically, as illustrated in FIGS. 24A-24B and 25A-25B, after forming the first patterned mask layer 228 over the second region 200B, an etching process is performed to pattern the bottom isolation layers 226 while using the first patterned mask layer 228 as an etch mask. The etching process selectively removes portions of the bottom isolation layers 226 in the first region 200A, leaving portions of the bottom isolation layers 226 in the second region 200B. The portions of the bottom isolation layers 226 in the second region 200B may be referred to as bottom isolation layers 226'. Due to the removal of the portions of the bottom isolation layers 226 in the first region 200A, top surfaces of the substrate 202 in the first region 200A that were previously covered by the bottom isolation layers 226 are exposed, as represented in FIGS. 25A-25B.

Figures 26A, 26B:
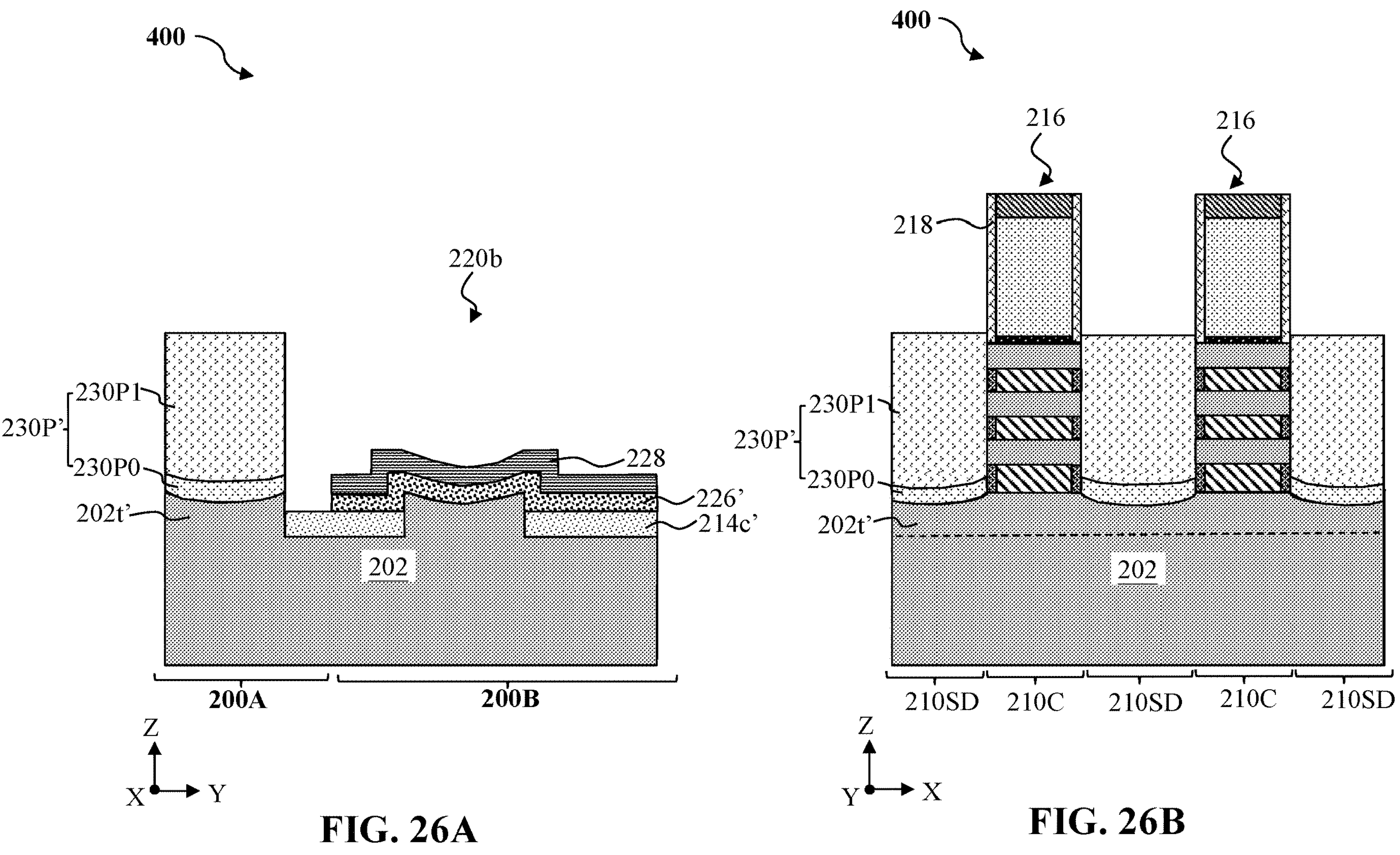
Figures 27A, 27B:
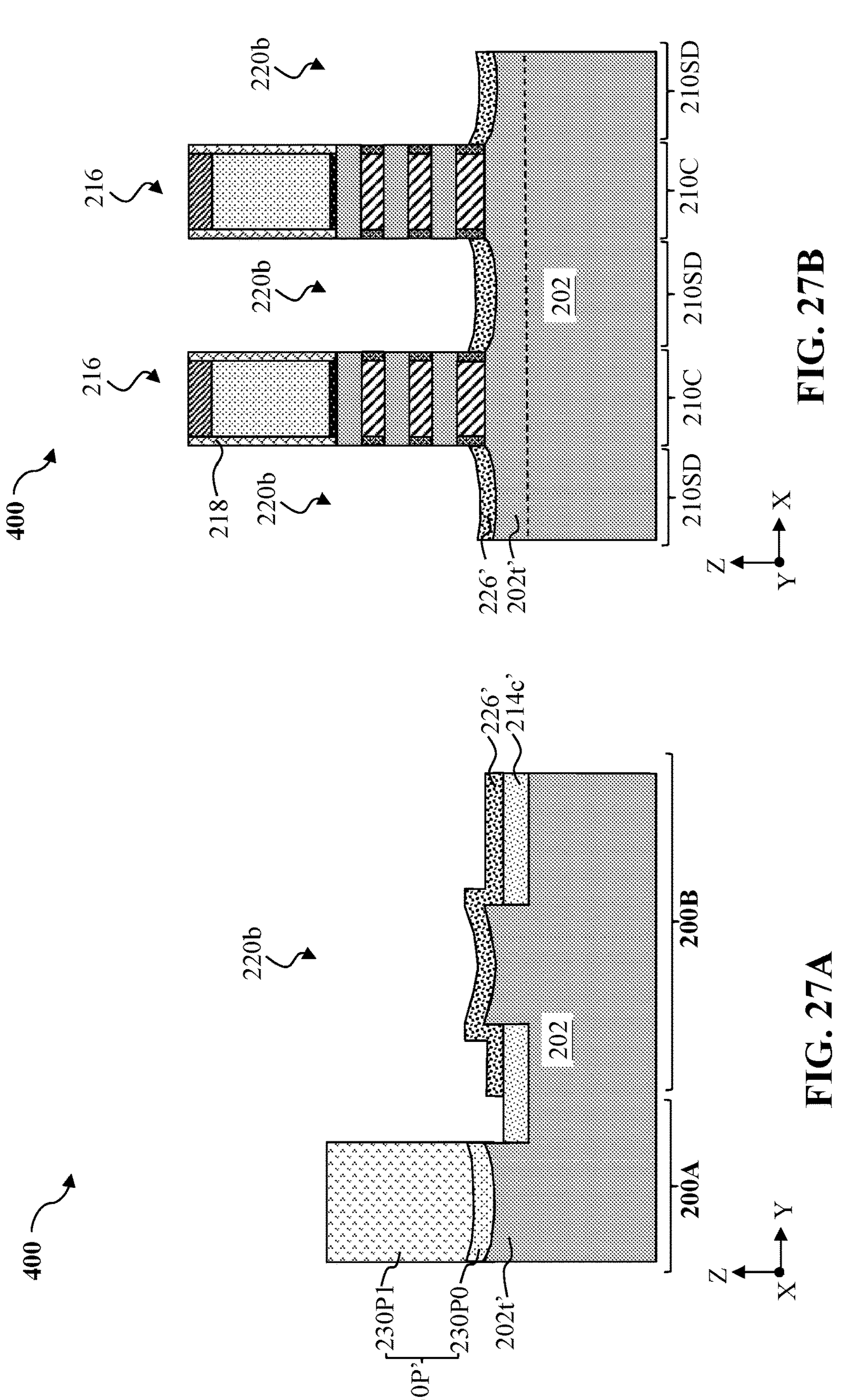
FIGS. 27B and 28B illustrate fragmentary cross-sectional views of an exemplary workpiece taken along line E-E' shown in FIG. 12 during various fabrication stages in the method of FIG. 23, according to one or more aspects of the present disclosure.

Referring to FIGS. 23 and FIGS. 26A-26B, method 300 includes a block 304 where first-type source/drain features 230P' are formed in the first region 200A. In the present embodiments, the first-type source/drain features 230P' includes p-type source/drain features. Different from the first-type source/drain feature 230P that is free of an undoped semiconductor layer, the first-type source/drain features 230P' includes an undoped semiconductor layer 230P0 and doped semiconductor layer(s) 230P1. In an embodiment, the undoped semiconductor layer 230P0 includes undoped silicon germanium, and the doped semiconductor layer 230P1 may include silicon germanium with p-type dopants. The undoped semiconductor layer 230P0 and the doped semiconductor layer 230P1 may be epitaxially formed. Since the top surfaces of the substrate 202 in the first region 200A that were previously covered by the bottom isolation layers 226 are exposed, the undoped semiconductor layer 230P0 and/or the doped semiconductor layer 230P1 may be grown not only from the exposed sidewall surfaces of the channel layers, but also from the exposed top surfaces of the substrate 202 in the first region 200A in a bottom-up way. By enabling the first-type source/drain features 230P' epitaxially to be grown in a bottom-up way, carrier mobilities of the to-be-formed p-type GAA transistors may be increased, and current leakage may be reduced due to the formation of the undoped semiconductor layer 230P0. In some embodiments, in addition to form the undoped semiconductor layer 230P0, an anti-punch through (APT) implantation process may be performed to form an anti-punch through (APT) layer (not shown) in the portion of the substrate 202 in the first region 200A. The APT implantation process may be performed before forming the vertical stack 204 over the substrate 202. The APT layer is a doped region in substrate 202 that is configured to prevent punch-through (i.e., prevent undesired merging of and/or negligible spacing between drain depletion regions and source depletion regions, where such can cause undesired conduction paths and/or leakage current between source/drains and thus impede switching functionality of a transistor) and/or unwanted dopant diffusion. In the first region 200A for forming p-type GAA transistors, the APT layer can include n-type dopants, such as phosphorus and/or arsenic.

Figures 28A, 28B:
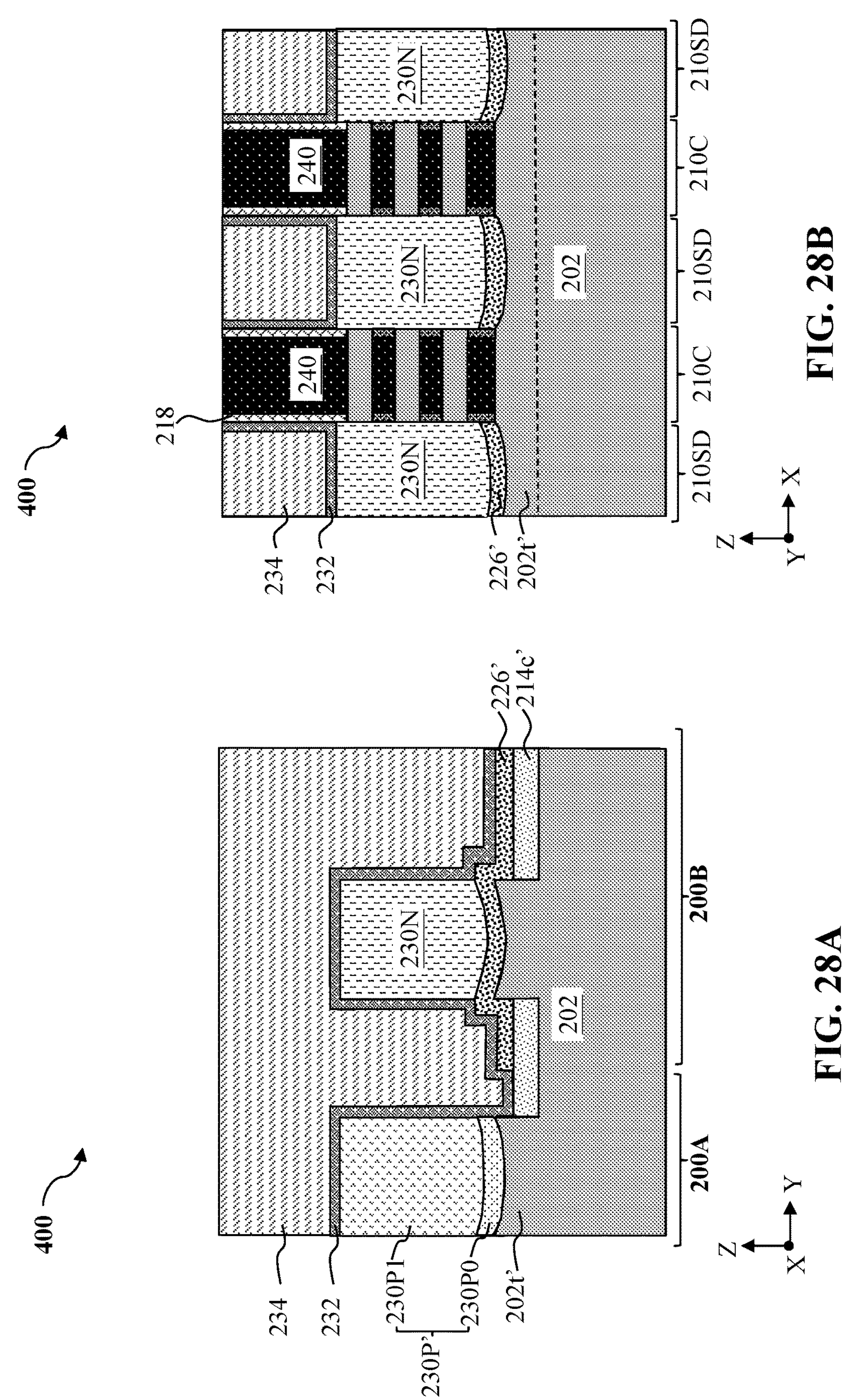
Figure 29:
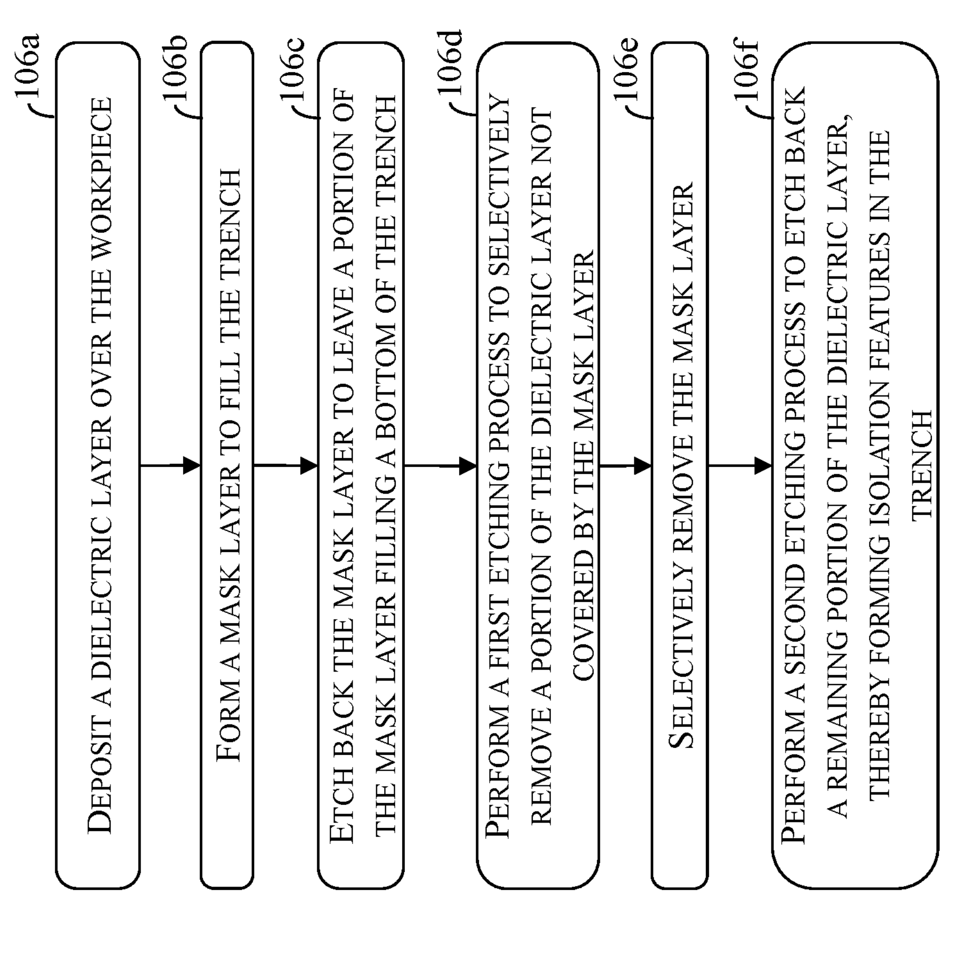
FIG. 29 illustrates a flowchart of an alternative method for fabricating an isolation feature in the semiconductor structure, according to various embodiments of the present disclosure.

Referring to FIGS. 23, 27A-27B, and 28A-28B, method 300 includes a block 308 where the first patterned mask layer 228 is selectively removed and second-type source/drain features 230N are formed in the second region 200B. After forming the first-type source/drain features 230P' in the first region 200A, the first patterned mask layer 228 may be selectively removed to expose the bottom isolation layers 226' in the second region 200B. Another patterned mask layer may be formed over the first region 200A to protect the first-type source/drain features 230P' during subsequent epitaxial growth process(es). With the another patterned mask layer formed over the first region 200A, second-type source/drain features 230N are then formed in the source/drain trenches 220*b* in the second region 200B and on the bottom isolation layers 226'. The another patterned mask layer that is formed over the first region 200A may be selectively removed after the formation of the second-type source/drain features 230N. As described above with reference to FIGS. 17A-17B and 19A-19B, since the top surfaces of the substrate 202 in the second region 200B are covered by the bottom isolation layers 226', the second-type source/drain features 230N is free of an undoped semiconductor layer and may be epitaxially grown from the exposed sidewall surfaces of the channel layers and would not be epitaxially grown from the substrate 202. After forming the first-type source/drain features 230P' in the first region 200A and the second-type source/drain features 230N in the second region 200B, operations in blocks 122, 124, 126 and 128 described with reference to FIG. 1 may be performed to finish the fabrication of the semiconductor structure 400. Thus, by employing the bottom isolation layers 226' in the second region 200B and forming the APT layer and/or undoped semiconductor layer 230P0 in the first region 200A, high carrier mobility of carriers may be obtained in the p-type GAA transistors, and both p-type GAA transistors and n-type GAA transistors may have less leakage current. As depicted in FIG. 28A, the CESL 232 includes a portion over and in direct contact with the isolation feature 214*c*' and a portion over and in direct contact with the bottom isolation layer 226'.

Figure 30:
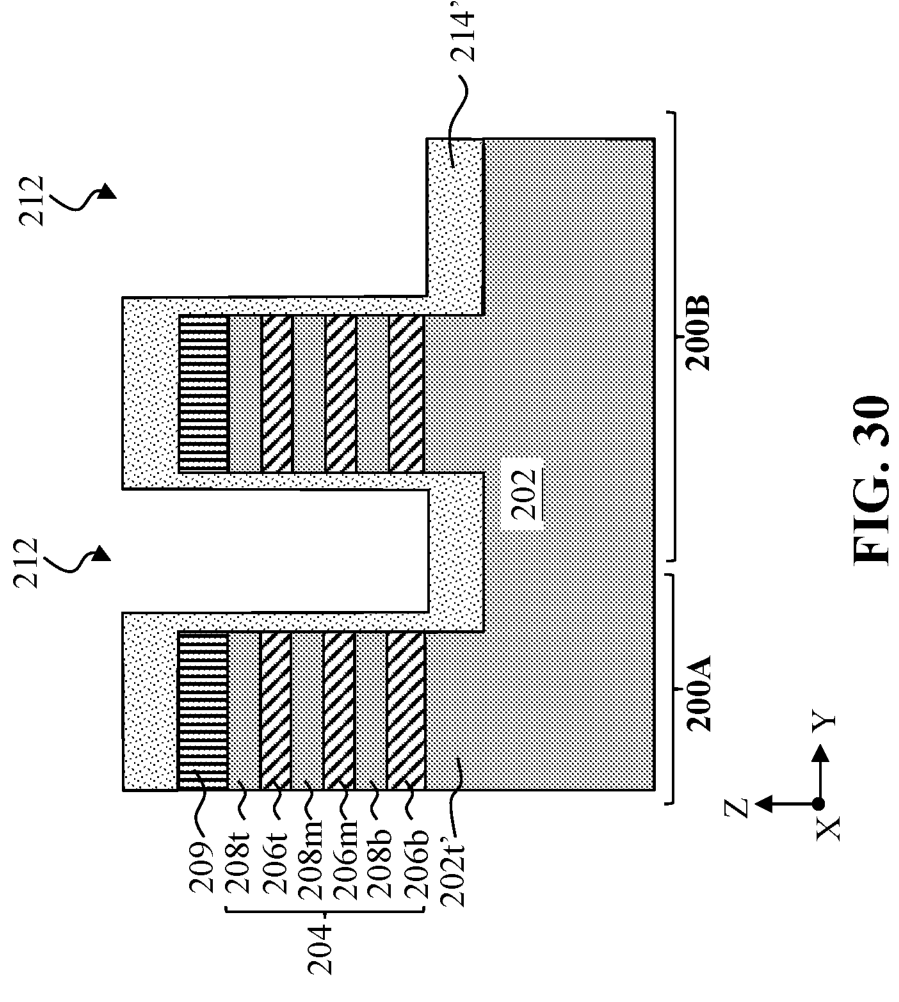
Figure 30:

In the above embodiments described with reference to FIGS. 1 and FIGS. 5A-6A, the isolation feature 214*c*' is formed by a combination of PVD deposition process, a CMP process and an etch back process. FIG. 29 depicts an alternative method 500 for forming the isolation feature 214*c*' in the trench 212. The method 500 is conducted after the operations in blocks 102 and 104 in method 100 are performed. Referring to FIGS. 29 and 30, method 500 includes a block 106*a* where a dielectric layer 214' is deposited over the workpiece 200 shown in FIG. 4A. The dielectric layer 214' is similar to the dielectric layer 214 and repeated description is omitted for reason of simplicity. In an embodiment, the dielectric layer 214' includes silicon nitride (SiN) and is formed by PVD, CVD, ALD or other suitable processes.

Referring to FIGS. 29 and 31, method 500 includes a block 106*b* where a mask layer 290 is formed over the workpiece 200. In the present embodiments, the mask layer 290 includes a bottom antireflective coating (BARC) layer. The BARC layer 290 is formed over the dielectric layer 214' and may include silicon oxynitride, a polymer, or a suitable material. After the forming of the BARC layer 290, the trenches 212 are substantially filled by the dielectric layer 214' and the BARC layer 290.

Figure 32:
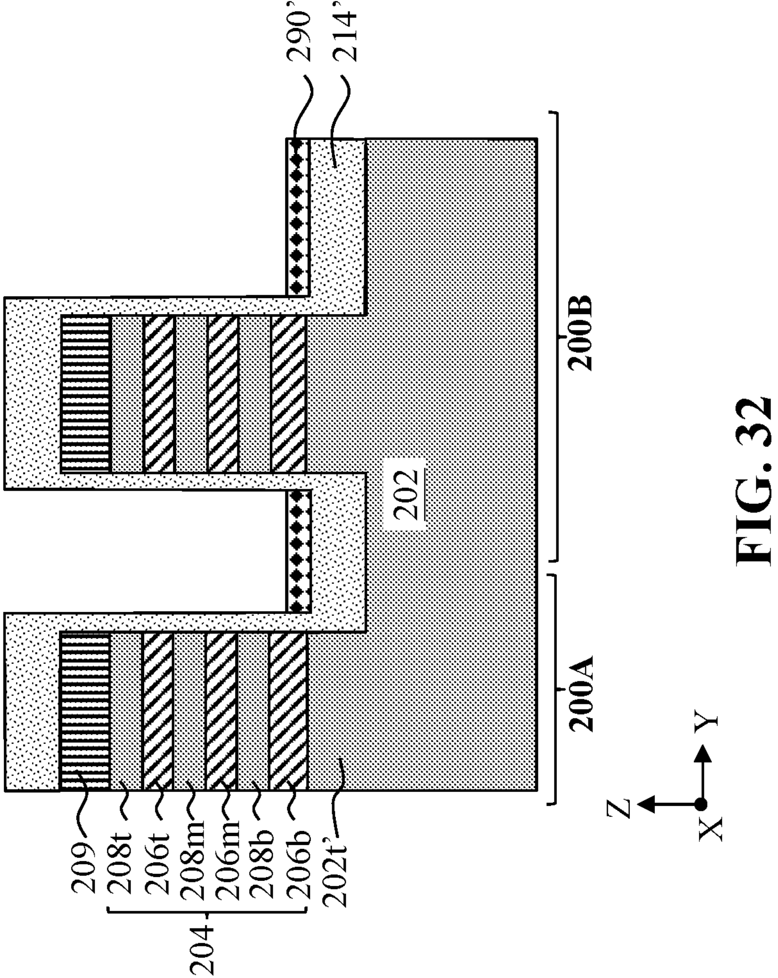
Figure 32:

Referring to FIGS. 29 and 32, method 500 includes a block 106*c* where the mask layer 290 is etched back to leave a portion 290' of the mask layer 290 covering a portion of the dielectric layer 214'. The portion 290' of the mask layer 290 may be referred to as the mask layer 290'. More specifically, an etching process is performed to selectively remove an upper portion of the BARC layer 290 to expose the portion of the dielectric layer 214' formed on the patterned hard mask layer 209 and an upper part of the portion of the dielectric layer 214' formed on the sidewall surfaces of the patterned vertical stack 204. That is, the mask layer 290' covers a lower part of the portion of the dielectric layer 214' formed on the sidewall surfaces of the patterned vertical stack 204 and also covers the portion of the dielectric layer 214' formed on the exposed surfaces of the substrate 202. In an embodiment, to enable the substantially removal of the bottommost sacrificial layer **206*b* in subsequent channel release process while providing enough isolation between the two fin-shaped structures, a top surface of the mask layer 290' is above a top surface of the mesa structure 202*t*' and is below a top surface of the bottommost sacrificial layer 206*b***.

Referring to FIGS. 29 and 33, method 500 includes a block **106*d* where a first etching process is performed to selectively remove portions of the dielectric layer 214' not covered by the mask layer 290'. While using the mask layer 290' as an etch mask, the first etching process is performed to selectively etch away the portions of the dielectric layers 214' not covered by the mask layer 290', as illustrated in FIG. 33**. The first etching process may be a dry etch process, a wet etch process, or a suitable etch process.

Referring to FIGS. 29 and 34, method 500 includes a block **106*e* where the mask layer 290' is selectively removed. After selectively removing the portions of the dielectric layers 214', the mask layer 290' is selectively removed using a suitable etching process. In embodiments represented in FIG. 34, after the removal of the mask layer 290', each dielectric layer 214' includes a portion on the lower sidewall surface of the patterned vertical stack 204 and a portion on the top surface of the substrate 202**.

Referring to FIGS. 29 and 35, method 500 includes a block **106*f* where a second etching process is performed to selectively etch back the dielectric layers 214' to form isolation feature 214*i*' over the substrate 202. In an embodiment, the second etching process includes an isotropic etching process configured to selectively etch the dielectric layers 214' without substantially etching the channel layers and sacrificial layers. The duration of the isotropic etching process may be controlled such that the portions of the dielectric layers 214' formed on the sidewall surface of the vertical stacks 204 are fully removed. Due to the performing of the isotropic etching process, the portions of the dielectric layers 214' formed on the substrate 202 are also slightly etched. The portion of the dielectric layer 214' formed on the substrate 202 after the performing of the isotropic etching process may be referred to as an isolation feature 214*i*'. After forming the isolation feature 214*i*', the patterned hard mask layer 209 may be selectively removed, and operations in blocks 108-128 of method 100 in FIG. 1 may be performed to finish the fabrication process. As described above, the method 500 for forming the isolation features 214*i*' may also be applied to form the bottom isolation layers 226**, and repeated description is omitted for reason of simplicity.

Although not intended to be limiting, one or more embodiments of the present disclosure provide many benefits to a semiconductor structure and the formation thereof. For example, the present disclosure provides a semiconductor structure having thin dielectric layers as isolation features between two adjacent active regions to reduce defects caused by a high thermal budget process and bottom isolation layers formed between source/drain features and the substrate to reduce or suppress leakage current through a mesa structure with little to no effect on other electrical characteristics of a GAA transistor, such as channel resistance. The bottom isolation layers can substantially suppress and/or eliminate any parasitic transistor formed between the gate structure, epitaxial source/drain features, and underlying semiconductor mesa structure, thereby reducing and/or blocking leakage current through the semiconductor mesa structure. GAA transistors disclosed herein thus exhibit better off-state control and/or overall improved performance. In another embodiment, an n-type GAA transistor may include the bottom isolation layer, and a p-type GAA transistor may be free of the bottom isolation layer, and the leakage current associated with the p-type GAA transistor may be suppressed by forming an undoped semiconductor layer in source/drain trench and on the substrate and/or forming an APT layer in the corresponding mesa structure. Thus, carrier mobility of carriers in the p-type GAA transistor may be increased without substantially increasing the leakage current of the p-type GAA transistor. Embodiments of the disclosed methods can be readily integrated into existing processes and technologies for manufacturing GAA transistors.

The present disclosure provides for many different embodiments. Semiconductor structures and methods of fabrication thereof are disclosed herein. In one exemplary aspect, the present disclosure is directed to a method. The method includes receiving a workpiece comprising a first region and a second region, the workpiece comprising a first fin over a substrate and in the first region and a second fin over the substrate and in the second region and separated from the first fin by a trench. The method also includes forming an isolation feature on the substrate and between the first fin and the second fin, forming a dummy gate stack engaging the first fin and the second fin, selectively recessing portions of the first fin and the second fin not covered by the dummy gate stack to form first source/drain openings in the first region and second source/drain openings in the second region, forming a first dielectric layer in the first and second source/drain openings and on the isolation feature, after the forming of the first dielectric layer, forming first source/drain features in the first source/drain openings and on the first dielectric layer, forming second source/drain features in the second source/drain openings and on the first dielectric layer, selectively removing the dummy gate stack to form a gate trench, and forming a gate structure in the gate trench.

In some embodiments, the forming of the isolation feature may include performing a physical vapor deposition process to form a second dielectric layer over the workpiece to partially fill the trench, performing a planarization process to remove a portion of the second dielectric layer over the first and second fins, and selectively recessing a remaining portion of the second dielectric layer to remove a portion of the second dielectric layer on sidewall surfaces of the first and second fins to form the isolation feature on the substrate. In some embodiments, the forming of the isolation feature may include forming a second dielectric layer over the workpiece to partially fill the trench, the second dielectric layer comprises a first portion over top surfaces of the first and second fins, a second portion on sidewall surfaces of the first and second fins, and a third portion on the substrate, forming a mask layer over the second dielectric layer to fill a remaining portion of the trench, recessing the mask layer to expose the first portion of the second dielectric layer and an upper part of the second portion of the second dielectric layer, selectively removing the first portion and the upper part of the second portion of the second dielectric layer, selectively removing the mask layer, and etching back the third portion and a lower part of the second portion of the second dielectric layer to form the isolation feature. In some embodiments, the first fin may include a vertical stack of alternating channel layers and sacrificial layers, and the method further may also include, before the forming of the first dielectric layer, selectively recessing the sacrificial layers to form inner spacer recesses, forming inner spacer features in the inner spacer recesses, and selectively removing the sacrificial layers, the gate structure further wraps around each channel layer of the channel layers. In some embodiments, the first dielectric layer may be in direct contact with a sidewall surface of a bottommost inner spacer feature of the inner spacer features. In some embodiments, a topmost surface of the first dielectric layer may be below a bottom surface of a bottommost channel layer of the channel layers. In some embodiments, a thickness of a bottommost sacrificial layer of the sacrificial layers may be greater than a thickness of a topmost sacrificial layer of the sacrificial layers. In some embodiments, a ratio of a thickness of the isolation feature to a thickness of a topmost channel layer of the channel layers may be between about 1 and 2. In some embodiments, the first source/drain features and the second source/drain features may be free of undoped semiconductor layers. In some embodiments, the forming of the first dielectric layer may include performing a physical vapor deposition process to form a dielectric material layer over the workpiece, performing a planarization process to remove a portion of the dielectric material layer over the dummy gate stack, etching back the dielectric material layer to remove a portion of the dielectric material layer on sidewall surfaces of the dummy gate stack and the first and second fins to form the first dielectric layer.

In another exemplary aspect, the present disclosure is directed to a method. The method includes forming a vertical stack of alternating channel layers and sacrificial layers over a substrate, patterning the vertical stack and a top portion of the substrate to form a fin-shaped structure, where a ratio of a thickness of the patterned top portion of the substrate to a thickness of a channel layer of the channel layers is between about 1 and about 2, forming an isolation feature on the substrate and adjacent to the fin-shaped structure, forming a dummy gate stack over a channel region of the fin-shaped structure, recessing a source/drain region of the fin-shaped structure to form a source/drain opening, forming a dielectric layer comprising a first portion in the source/drain opening and in direct contact with the substrate and a second portion on the isolation feature, epitaxially growing a doped semiconductor layer in the source/drain opening, wherein the doped semiconductor layer is spaced apart from the substrate by the dielectric layer, selectively removing the dummy gate stack and selectively removing the sacrificial layers, and forming a gate structure wrapping around and over the channel layers.

In some embodiments, the forming of the isolation feature may include depositing a dielectric material layer over the substrate, wherein the dielectric material layer comprises a first portion disposed on the substrate, a second portion extending along sidewall surfaces of the fin-shaped structure, and a third portion over the fin-shaped structure, wherein a thickness of the first portion of the dielectric material layer is no less than a thickness of the patterned top portion of the substrate, and removing the second portion and the third portion of the dielectric material layer to form the isolation feature on the substrate. In some embodiments, the dielectric material layer may be free of oxygen. In some embodiments, the method may also include selectively recessing the sacrificial layers to form inner spacer recesses, and forming inner spacer features in the inner spacer recesses, where a sidewall surface of the dielectric layer may be in direct contact with a sidewall surface of a bottommost inner spacer feature of the inner spacer features. In some embodiments, a top surface of the first portion of the dielectric layer may be above a top surface of the patterned top portion of the substrate and may be below a bottom surface of a bottommost channel layer of the channel layers. In some embodiments, the fin-shaped structure is a first fin-shaped structure, and the patterning of the vertical stack and the top portion of the substrate further forms a second fin-shaped structure, the method may also include recessing a source/drain region of the second fin-shaped structure to form a source/drain trench, wherein the dielectric layer further comprises a third portion in the source/drain trench, forming a patterned mask film on the third portion of the dielectric layer, selectively removing the third portion of the dielectric layer to expose the substrate in the source/drain trench, and forming an undoped semiconductor layer in the source/drain trench and on the substrate, and forming another doped semiconductor layer in the source/drain trench and on the undoped semiconductor layer.

In yet another exemplary aspect, the present disclosure is directed to a semiconductor structure. The semiconductor structure includes a substrate including a first mesa structure and a second mesa structure, an isolation feature extending between the first mesa structure and the second mesa structure, a first vertical stack of nanostructures directly over the first mesa structure, first source/drain features coupled to the first vertical stack of nanostructures, a dielectric layer comprising a first portion disposed on the isolation feature and a second portion disposed between the first source/drain features and the substrate, and a first gate structure wrapping around each nanostructure of the first vertical stack of nanostructures.

In some embodiments, the semiconductor structure may also include an inner spacer feature disposed between a bottommost nanostructure of the first vertical stack of nanostructures and the first mesa structure, where the second portion of the dielectric layer may be in direct contact with the inner spacer feature, and a top surface of the second portion of the dielectric layer may be lower than a top surface of the inner spacer feature. In some embodiments, a ratio of a thickness of the isolation feature to a thickness of a topmost nanostructure of the first vertical stack of nanostructures may be between about 1 and 2. In some embodiments, the semiconductor structure may also include a second vertical stack of nanostructures directly over the second mesa structure, second source/drain features coupled to the second vertical stack of nanostructures, a second gate structure wrapping around each nanostructure of the second vertical stack of nanostructures, where the second source/drain features may include an undoped semiconductor layer disposed on the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

receiving a workpiece comprising a first region and a second region, the workpiece comprising:

a first fin over a substrate and in the first region, and a second fin over the substrate and in the second region and separated from the first fin by a trench, forming an isolation feature on the substrate and between the first fin and the second fin;

forming a dummy gate stack extending over the first fin and the second fin;

selectively recessing portions of the first fin and the second fin not covered by the dummy gate stack to form first source/drain openings in the first region and second source/drain openings in the second region;

forming a first dielectric layer in the first and second source/drain openings and on the isolation feature;

after the forming of the first dielectric layer, forming first source/drain features in the first source/drain openings and on the first dielectric layer, wherein the first source/drain features are vertically separated from the substrate by the first dielectric layer;

forming second source/drain features in the second source/drain openings;

forming a contact etch stop layer over the first source/drain features and the second source/drain features;

forming an interlayer dielectric layer over the contact etch stop layer, wherein a dielectric constant of the first dielectric layer is greater than a dielectric constant of the interlayer dielectric layer;

selectively removing the dummy gate stack to form a gate trench; and forming a gate structure in the gate trench.

2. The method of claim 1, wherein the forming of the isolation feature comprises:

performing a physical vapor deposition process to form a second dielectric layer over the workpiece to partially fill the trench;

performing a planarization process to remove a portion of the second dielectric layer over the first and second fins; and selectively recessing a remaining portion of the second dielectric layer to remove a portion of the second dielectric layer on sidewall surfaces of the first and second fins to form the isolation feature on the substrate.

3. The method of claim 1, wherein the forming of the isolation feature comprises:

forming a second dielectric layer over the workpiece to partially fill the trench, the second dielectric layer comprises a first portion over top surfaces of the first and second fins, a second portion on sidewall surfaces of the first and second fins, and a third portion on the substrate;

forming a mask layer over the second dielectric layer to fill a remaining portion of the trench;

recessing the mask layer to expose the first portion of the second dielectric layer and an upper part of the second portion of the second dielectric layer;

selectively removing the first portion and the upper part of the second portion of the second dielectric layer;

selectively removing the mask layer; and etching back the third portion and a lower part of the second portion of the second dielectric layer to form the isolation feature.

4. The method of claim 1, wherein the first fin comprises a vertical stack of alternating channel layers and sacrificial layers, wherein the method further comprises:

before the forming of the first dielectric layer, selectively recessing the sacrificial layers to form inner spacer recesses;

forming inner spacer features in the inner spacer recesses; and selectively removing the sacrificial layers, wherein the gate structure further wraps around each channel layer of the channel layers.

5. The method of claim 4, wherein the first dielectric layer is in direct contact with a sidewall surface of a bottommost inner spacer feature of the inner spacer features.

6. The method of claim 5, wherein a topmost surface of the first dielectric layer is below a bottom surface of a bottommost channel layer of the channel layers.

7. The method of claim 4, wherein a thickness of a bottommost sacrificial layer of the sacrificial layers is greater than a thickness of a topmost sacrificial layer of the sacrificial layers.

8. The method of claim 1, wherein a ratio of a thickness of the isolation feature to a thickness of a topmost channel layer of the channel layers is between about 1 and 2.

9. The method of claim 1, wherein the first source/drain features and the second source/drain features are free of undoped semiconductor layers.

10. The method of claim 1, wherein the forming of the first dielectric layer comprises:

performing a physical vapor deposition process to form a dielectric material layer over the workpiece;

performing a planarization process to remove a portion of the dielectric material layer over the dummy gate stack; and etching back the dielectric material layer to remove a portion of the dielectric material layer on sidewall surfaces of the dummy gate stack and the first and second fins to form the first dielectric layer.

11. A method, comprising:

forming a vertical stack of alternating channel layers and sacrificial layers over a substrate;

patterning the vertical stack and a top portion of the substrate to form a fin-shaped structure, wherein a ratio of a thickness of the patterned top portion of the substrate to a thickness of a channel layer of the channel layers is between about 1 and about 2;

forming an isolation feature on the substrate and adjacent to the fin-shaped structure;

forming a dummy gate stack over a channel region of the fin-shaped structure;

recessing a source/drain region of the fin-shaped structure to form a source/drain opening;

forming a dielectric layer comprising a first portion in the source/drain opening and in direct contact with the substrate and a second portion on the isolation feature;

epitaxially growing a doped semiconductor layer in the source/drain opening, wherein the doped semiconductor layer is spaced apart from the substrate by the dielectric layer;

selectively removing the dummy gate stack and selectively removing the sacrificial layers; and forming a gate structure wrapping around and over the channel layers.

12. The method of claim 11, wherein the forming of the isolation feature comprises:

depositing a dielectric material layer over the substrate, wherein the dielectric material layer comprises a first portion disposed on the substrate, a second portion extending along sidewall surfaces of the fin-shaped structure, and a third portion over the fin-shaped structure, wherein a thickness of the first portion of the dielectric material layer is no less than a thickness of the patterned top portion of the substrate; and removing the second portion and the third portion of the dielectric material layer to form the isolation feature on the substrate.

13. The method of claim 12, wherein the dielectric material layer is free of oxygen.

14. The method of claim 11, further comprising:

selectively recessing the sacrificial layers to form inner spacer recesses; and forming inner spacer features in the inner spacer recesses, wherein a sidewall surface of the dielectric layer is in direct contact with a sidewall surface of a bottommost inner spacer feature of the inner spacer features.

15. The method of claim 11, wherein a top surface of the first portion of the dielectric layer is above a top surface of the patterned top portion of the substrate and is below a bottom surface of a bottommost channel layer of the channel layers.

16. The method of claim 11, wherein the fin-shaped structure is a first fin-shaped structure, and the patterning of the vertical stack and the top portion of the substrate further forms a second fin-shaped structure, the method further comprising:

recessing a source/drain region of the second fin-shaped structure to form a source/drain trench, wherein the dielectric layer further comprises a third portion in the source/drain trench;

forming a patterned mask film on the third portion of the dielectric layer;

selectively removing the third portion of the dielectric layer to expose the substrate in the source/drain trench; and forming an undoped semiconductor layer in the source/drain trench and on the substrate; and forming another doped semiconductor layer in the source/drain trench and on the undoped semiconductor layer.

17. A semiconductor structure, comprising:

a substrate including a first mesa structure and a second mesa structure, an isolation feature extending between the first mesa structure and the second mesa structure;

a first vertical stack of nanostructures directly over the first mesa structure;

first source/drain features coupled to the first vertical stack of nanostructures;

a dielectric layer comprising a first portion disposed on the isolation feature and a second portion disposed between the first source/drain features and the substrate, wherein the dielectric layer comprises an oxygen-free material;

a first gate structure wrapping around each nanostructure of the first vertical stack of nanostructures, wherein the first gate structure comprises a gate dielectric layer and a gate electrode over the gate dielectric layer.

18. The semiconductor structure of claim 17, further comprising:

an inner spacer feature disposed between a bottommost nanostructure of the first vertical stack of nanostructures and the first mesa structure, wherein the second portion of the dielectric layer is in direct contact with the inner spacer feature, and a top surface of the second portion of the dielectric layer is lower than a top surface of the inner spacer feature.

19. The semiconductor structure of claim 17, wherein a ratio of a thickness of the isolation feature to a thickness of a topmost nanostructure of the first vertical stack of nanostructures is between about 1 and 2.

20. The semiconductor structure of claim 17, further comprising:

a second vertical stack of nanostructures directly over the second mesa structure;

second source/drain features coupled to the second vertical stack of nanostructures; and a second gate structure wrapping around each nanostructure of the second vertical stack of nanostructures, wherein the second source/drain features comprise an undoped semiconductor layer disposed on the substrate.

* * * * *